(12) United States Patent
Bae

(10) Patent No.: US 7,470,586 B2
(45) Date of Patent: Dec. 30, 2008

(54) MEMORY CELL HAVING BAR-SHAPED STORAGE NODE CONTACT PLUGS AND METHODS OF FABRICATING SAME

(75) Inventor: Jun-Shik Bae, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/939,472

(22) Filed: Nov. 13, 2007

(65) Prior Publication Data

US 2008/0064161 A1    Mar. 13, 2008

Related U.S. Application Data

(62) Division of application No. 10/891,806, filed on Jul. 14, 2004, now Pat. No. 7,312,489.

(30) Foreign Application Priority Data

Jul. 14, 2003    (KR) ................ 2003-48082

(51) Int. Cl.
*H01L 21/00*    (2006.01)
*H01L 21/44*    (2006.01)

(52) U.S. Cl. .............. 438/250; 438/253; 438/258; 438/396; 438/618; 438/637; 257/E21.507; 257/E21.587; 257/E21.648; 257/E21.659

(58) Field of Classification Search ................. 438/241, 438/242, 246, 250, 253, 258, 270, 393, 396, 438/618, 620, 903, 908; 257/E21.507, E21.579, 257/587, 648, 649, 657, 658, 659
See application file for complete search history.

(56) References Cited

U.S. PATENT DOCUMENTS 5,879,986 A    3/1999    Sung
5,895,239 A    4/1999    Jeng et al.

(Continued)

FOREIGN PATENT DOCUMENTS

KR    1999-003042    1/1999

(Continued)

OTHER PUBLICATIONS

English language translation of Korean Publication No. 1999-003042.

(Continued)

*Primary Examiner*—Michael S Lebentritt
(74) *Attorney, Agent, or Firm*—Marger Johnson & McCollom, P.C.

(57) ABSTRACT

According to embodiments of the invention, a bit line interlayer insulating layer is placed over a semiconductor substrate. A plurality of parallel bit line patterns are placed on the bit line interlayer insulating layer. Each of the bit line patterns has a bit line and a bit line capping layer pattern stacked thereon. Bit line spacers covers side walls of the bit line patterns, buried holes penetrate predetermined regions of the bit line interlayer insulating layer between the bit line patterns. And a plurality of storage node contact plugs are placed between the bit line patterns surrounding by the bit line spacers. At this time, the storage node contact plugs fill the buried holes.

9 Claims, 23 Drawing Sheets

U.S. PATENT DOCUMENTS

| | | | |
|---|---|---|---|
| 6,025,227 A * | 2/2000 | Sung | 438/253 |
| 6,037,216 A | 3/2000 | Liu et al. | |
| 6,127,260 A | 10/2000 | Huang | |
| 6,136,643 A | 10/2000 | Jeng et al. | |
| 6,150,213 A | 11/2000 | Luo et al. | |
| 6,255,160 B1 | 7/2001 | Huang | |
| 6,403,996 B1 * | 6/2002 | Lee | 257/256 |
| 6,528,368 B1 * | 3/2003 | Park | 438/253 |
| 6,897,145 B2 * | 5/2005 | Park | 438/637 |
| 7,387,931 B2 * | 6/2008 | Seo et al. | 438/243 |
| 2001/0001717 A1 | 5/2001 | Kumauchi et al. | |
| 2001/0046737 A1 * | 11/2001 | Ahn et al. | 438/253 |
| 2002/0034877 A1 * | 3/2002 | Shin et al. | 438/694 |
| 2002/0079536 A1 | 6/2002 | Terauchi et al. | |
| 2005/0003646 A1 * | 1/2005 | Park et al. | 438/586 |

FOREIGN PATENT DOCUMENTS

| | | |
|---|---|---|
| KR | 2000-0015399 | 3/2000 |
| KR | 2002-0002924 | 1/2002 |
| KR | 2003-0002871 | 1/2003 |
| KR | 2003-0059415 | 7/2003 |

OTHER PUBLICATIONS

English language translation of Korean Publication No. 2000-0015399.

English language translation of Korean Publication No. 2002-0002924.

English language translation of Korean Publication No. 2003-0002871.

English language translation of Korean Publication No. 2003-0059415.

* cited by examiner

MEMORY CELL HAVING BAR-SHAPED STORAGE NODE CONTACT PLUGS AND METHODS OF FABRICATING SAME

CROSS-REFERENCE TO RELATED APPLICATIONS

This patent application is a Divisional U.S. patent application Ser. No. 10/891,806, filed on Jul. 14, 2004, now pending, which claims priority from Korean Patent Application No. 2003-48082, filed on Jul. 14, 2003, the contents of which are hereby incorporated by reference in their entirety for all purposes.

BACKGROUND OF THE INVENTION

1. Field of the Invention

The invention relates generally to memory cells, and more particularly, to Dynamic Random Access Memory (DRAM) cells having bar-shaped storage node contact plugs and methods of fabricating the same.

2. Description of the Related Art

Generally, a semiconductor device having DRAM cells includes at least a cell in a cell array region. The cell includes a capacitor and a transistor, which are formed on an active region. The capacitor is formed of an upper electrode layer, a dielectric layer, and a lower electrode layer, and each of the lower and upper electrode layers comes in contact with a conductive layer. At this time, the conductive layer connected with the lower electrode layer is a doped polysilicon layer, and the conductive layer connected with the upper electrode layer may be formed of a metal layer. The conductive layer that is connected with the upper electrode layer can be significantly manipulated without impacting a design rule of the semiconductor device, unlike the conductive layer that is connected with the lower electrode layer.

However, the more that the design rule for the semiconductor device is reduced, the chance is greater that the conductive layer connected with the lower electrode layer is effected. The conductive layer connected with the lower electrode layer could partially overcome contravention of the reduced design rule, as the capacitor structure of the semiconductor device changes from a CUB (Capacitor Under Bit-line) structure into a COB (Capacitor Over Bit-line) structure.

Also, as semiconductor devices become increasingly integrated, certain features of the semiconductor device become increasingly important. These features include spaces between conductive layers connected with lower electrode layers on the cell array region, a diameter of a contact window connecting the lower electrode layer with the conductive layer, and the doping concentration for one or more layers that form the conductive layers.

Many schemes for increasing the diameter of the contact window while maintaining the reduced design rule have been proposed. That is, the contact regions may be enlarged by forming the contact window that connects the lower electrode layer with the conductive layer through a new semiconductor fabrication process that is different from existing semiconductor fabrication processes, or by modifying shapes of the lower electrode layer and the conductive layers. Accordingly, these schemes may be carried out by using the reduced design rule and the new semiconductor fabrication process without upgrading the semiconductor fabrication equipment.

On the other hand, U.S. Pat. No. 6,136,643 to Erik S. Jeng (the '643 patent) discloses a method of fabricating dynamic random access memory having a COB structure. According to the '643 patent, the method includes forming a DRAM cell having the capacitors of the COB structure as well as active regions, gate patterns, and bit line patterns. The method also includes forming openings in predetermined regions between the bit line patterns. The openings penetrate a third sacrificial insulating layer by using dual photo and etching processes. At this time, capacitor contact nodes that are formed on the active regions are exposed. Although sidewalls of the bit line patterns are covered with a third etch stop layer before the openings are formed, the sidewalls of the bit line patterns can be exposed because the dual etching processes cause excessive etching damage to the third etch stop layer. Thus, the lower electrode may be electrically shorted to the bit line patterns through the openings.

Embodiments of the invention address these and other disadvantages of the conventional art.

SUMMARY OF THE INVENTION

According to some embodiments of the invention, storage node contact plugs are formed in a bar shape to have sufficient contact with the storage nodes. Thus, the contact resistance between the storage node and the storage node contact plug may be freely controlled and the performance of the semiconductor device may be increased.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denotes like parts.

DETAILED DESCRIPTION OF THE INVENTION

Detailed reference will now be made to exemplary embodiments of DRAM cells having bar-shape storage node contact plugs and methods of fabricating the same. The embodiments are illustrated in the accompanying drawings.

Figure 1:
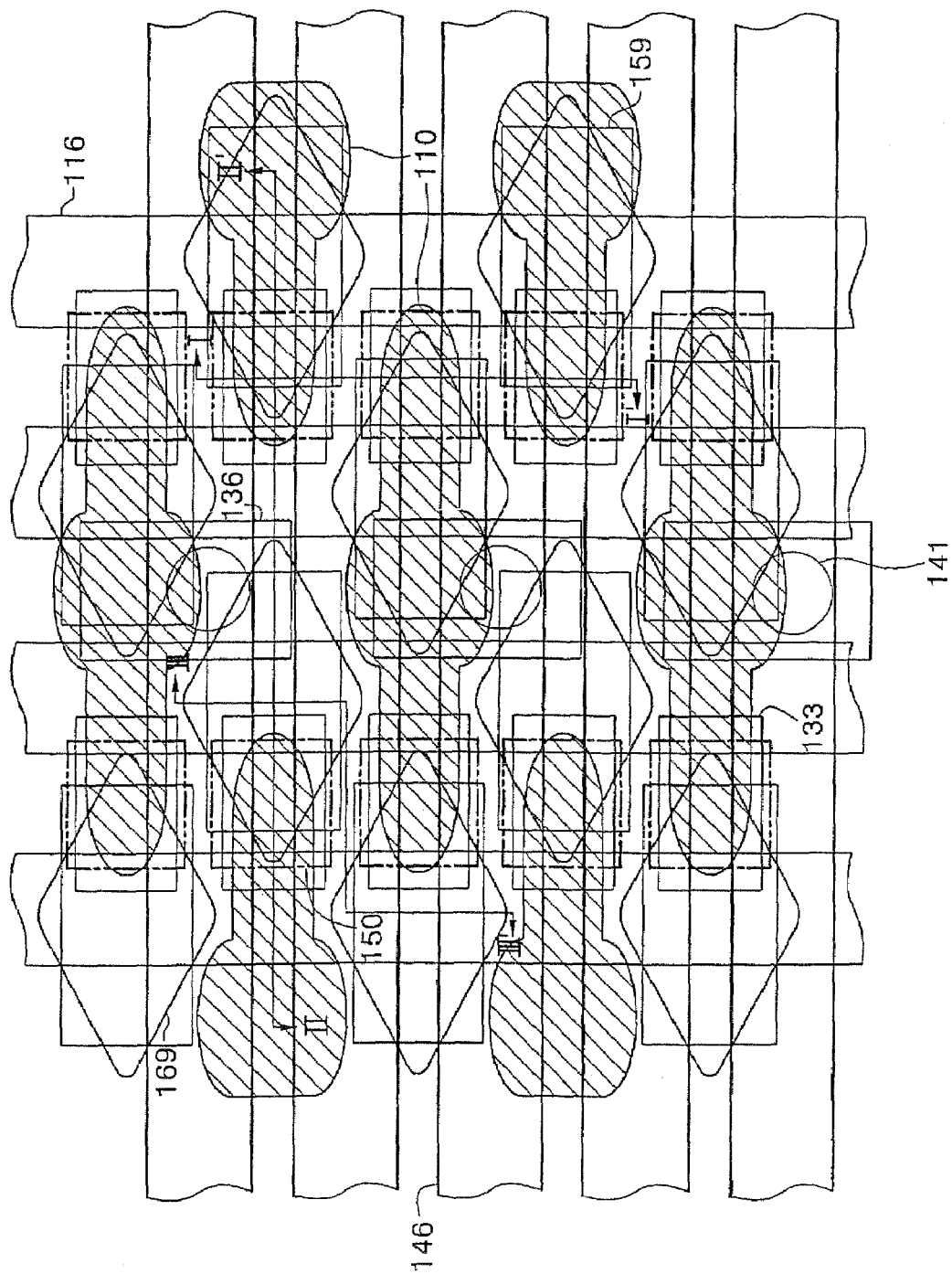
FIG. 1 is a layout diagram illustrating DRAM cells according to some embodiments of the invention.
Figure 2:
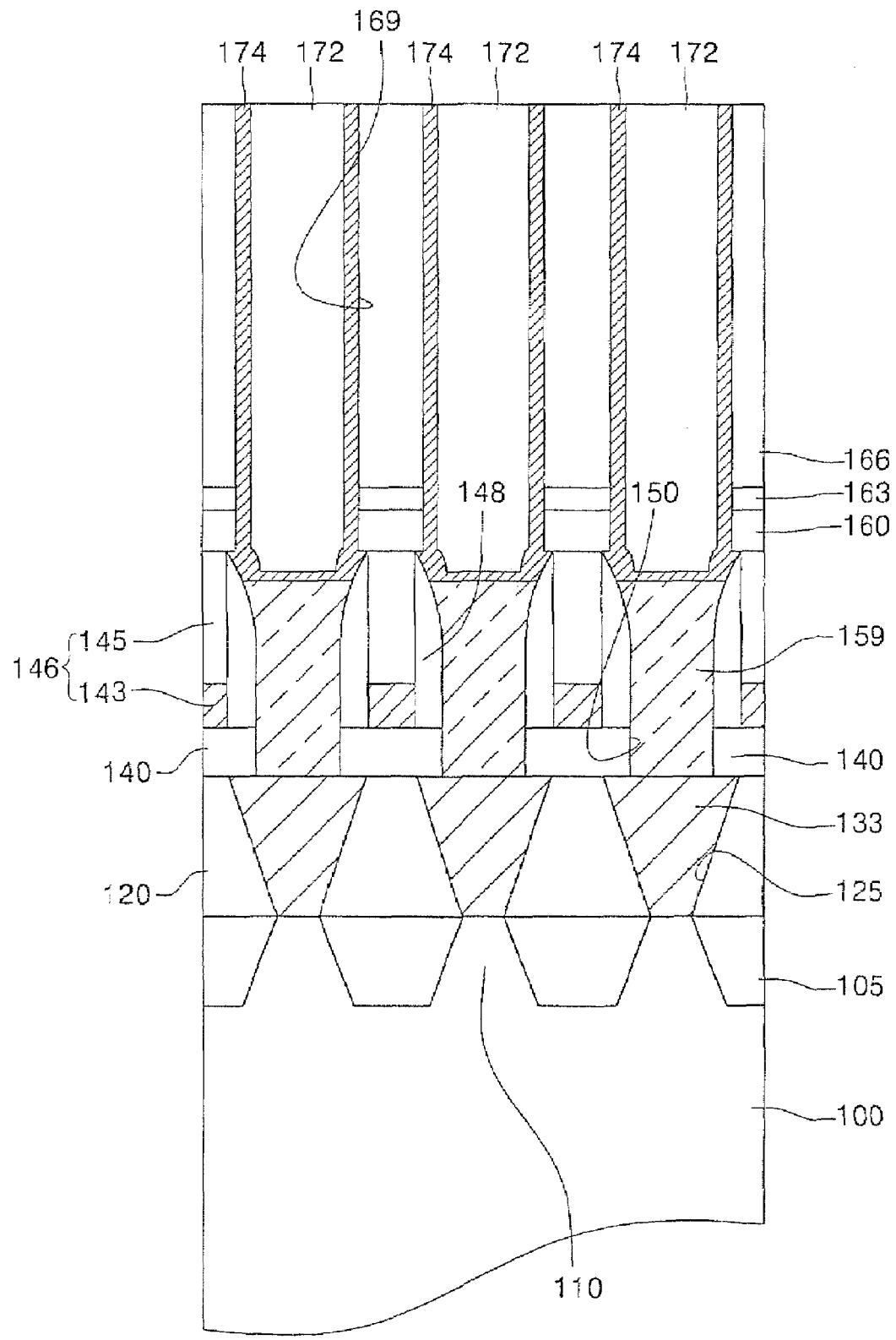
FIG. 2 is a cross-sectional diagram taken along line I-I' of FIG. 1.
Figure 3:
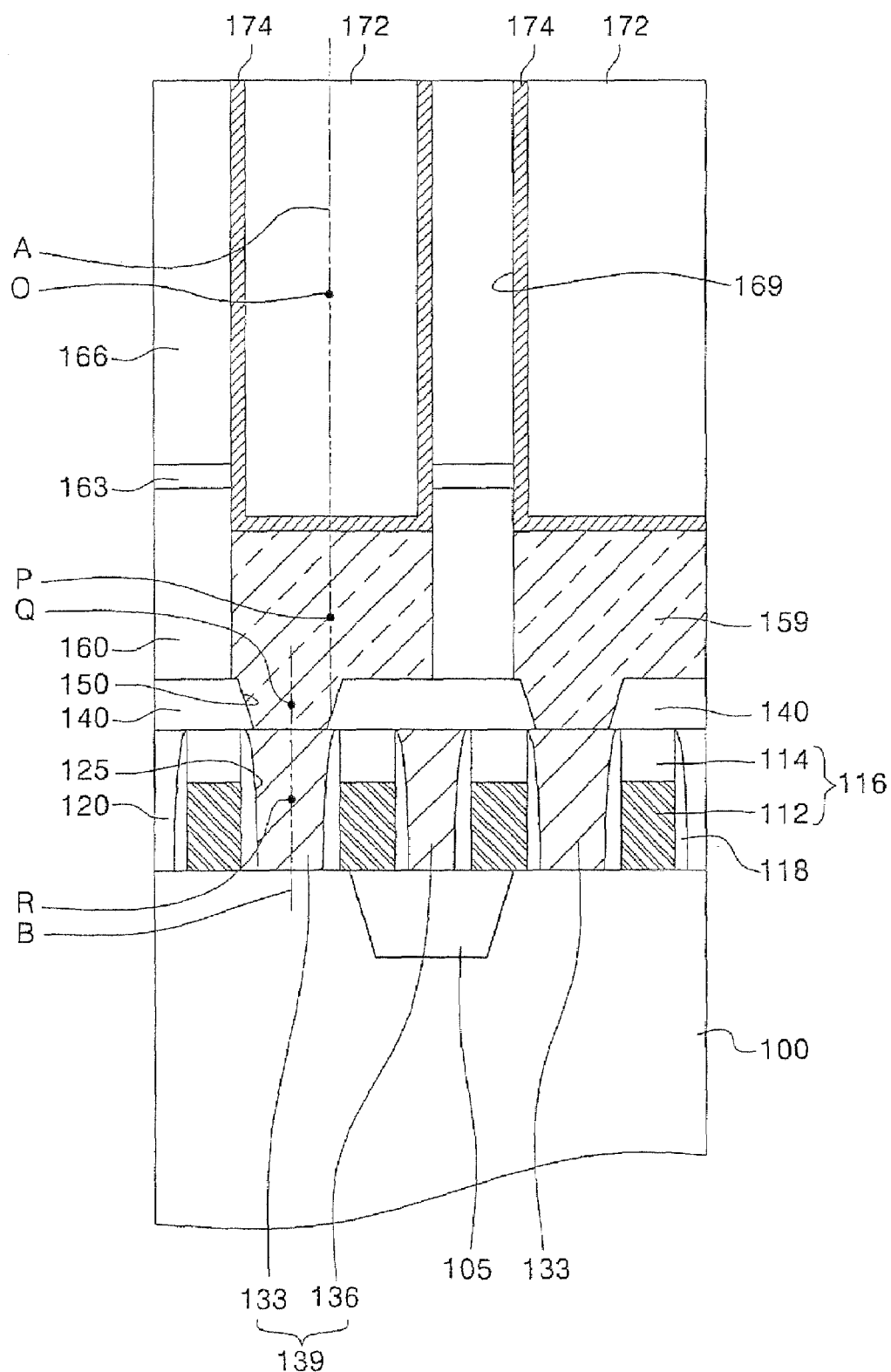
FIG. 3 is a cross-sectional diagram taken along line II-II' of FIG. 1.

FIG. 1 is a layout diagram illustrating DRAM cells according to some embodiments of the invention, and FIGS. 2 and 3 are cross-sectional diagrams illustrating taken along lines I-I' and II-II', respectively, of FIG. 1.

Referring to FIGS. 1 to 3, an isolation layer 105 is formed on a predetermined region of a semiconductor substrate 100 to isolate active regions 110, and gate patterns 116 are formed in a direction traversing the active regions 110 on the semiconductor substrate having the isolation layer 105. Each of the gate patterns 116 includes a gate 112 and a gate capping layer pattern 114 stacked thereon. It is desirable that the gate 112 consist of an N-type doped polysilicon layer or a polycide layer, and that the gate capping layer pattern 114 consist of a nitride layer. Sidewalls of the gate patterns 116 may be covered with gate spacers 118, which are insulating layers having an etching selectivity ratio different from the isolation layer 105. For example, it is desirable that the gate spacers 118 consist of a nitride layer.

The semiconductor substrate having the gate spacers 118 is covered with a pad interlayer insulating layer 120, which fills gap regions between the gate patterns 116 surrounded by the gate spacers 118. Then, pad holes 125 are placed between the gate patterns 116 to penetrate predetermined regions of the pad interlayer insulating layer 120 and to expose the active regions 110. Bit line landing pads 136 and storage node landing pads 133 are disposed to fill the pad holes 125. The bit line landing pads 136 and storage node landing pads 133 may be collectively referred to as landing pads 139. Preferably, the landing pads 139 consist of N-type doped polysilicon layer.

A bit line interlayer insulating layer 140 covers a surface of the semiconductor substrate having the landing pads 139, and the bit line interlayer insulating layer 140 is preferably an insulating layer having the same etching selectivity ratio as the pad interlayer insulating layer 120. Bit line contact holes 141 are disposed in predetermined regions of the semiconductor substrate 100 to penetrate the bit line interlayer insulating layer 140 and to expose the bit line landing pads 136. A plurality of parallel bit line patterns 146, which fill the bit line contact holes 141, are disposed on the bit line interlayer insulating layer 140. At this time, the bit line patterns 146 are positioned in a direction perpendicular to the gate patterns 116 as shown in FIG. 1. Each of the bit line patterns 146 includes a bit line 143 and a bit line capping layer pattern 145 stacked thereon. The bit line 143 may include an N-type doped polysilicon layer, a polycide layer, or a metal layer. The bit line capping layer pattern 145 may be an insulating layer having an etching selectivity ratio different from the bit line interlayer insulating layer 140. For example, it is desirable that the bit line capping layer pattern 145 consist of a nitride layer. Bit line spacers 148 are placed on sidewalls of the bit line patterns 146, and the bit line spacers 148 may consist of insulating layers having the same etching selectivity ratio as the bit line capping layer pattern 145. For example, it is desirable that the bit line spacers 148 consist of a nitride layer.

Buried holes 150 are disposed in predetermined regions between the bit line patterns 146 and surrounded by the bit line spacers 148 to penetrate the bit line interlayer insulating layer 140, and to expose the storage landing pads 133. As seen in FIG. 2, a width of the buried holes 150 is greater than a width of the bit line patterns 146. At this time, centers Q of the buried holes 150 and centers R of the pad holes 125 filled with the storage node landing pads 133 are positioned on an axis B perpendicular to the semiconductor substrate 100 in a direction parallel to the bit line patterns 146, as shown in FIG.3.

Storage node contact plugs 159 are disposed between the bit line patterns 146 to fill the buried holes 150. The top surfaces of the storage node contact plugs 159 are positioned lower than top surfaces of the bit line patterns 146 and the storage node contact plugs 159 separated by the bit line interlayer insulating layer 140 between the bit line patterns 146. Centers P of the storage node contact plugs 159 and the centers Q of the buried holes 150 are positioned on axes A and B that are perpendicular to the semiconductor substrate in a direction parallel to the bit line patterns 146. At this time, the vertical axes A and B are spaced apart from each other by a predetermined distance.

Storage nodes 174 are stacked on the storage node contact plugs 159 to be disposed on sidewalls of the storage node holes 169. The storage nodes 174 have cylindrical shapes and come in contact with top surfaces of the storage node contact plugs 159. Thus, the centers P of the storage node contact plugs 159 and centers O of the storage node holes 169 are positioned on the axis A perpendicular to the semiconductor substrate 100 in directions parallel to the gate patterns 116 and the bit line patterns 146. Gap regions between the storage nodes 174 may be filled with a protection layer 160, a etch stop layer 163, and a molding layer 166 stacked in sequence. The storage node holes 169 may be filled with sacrificial layers 172.

A method of fabricating DRAM cells according to some embodiments of the invention will be now described with reference to the accompanying drawings.

FIGS. 4, 6, 8, 10, 12, 14, 16, 18, 20 and 22 are cross-sectional diagrams taken along line I-I' of FIG. 1 that illustrate a method of fabricating DRAM cells according to some embodiments of the invention. FIG. 14a is a cross-sectional diagram taken along line III-III' of FIG. 1. FIGS. 5, 7, 9, 11, 13, 15, 17, 19, 21 and 23 are cross-sectional diagrams taken along line II-II' of FIG. 1 that illustrate a method of fabricating DRAM cells according to some embodiments of the invention.

Figure 4:
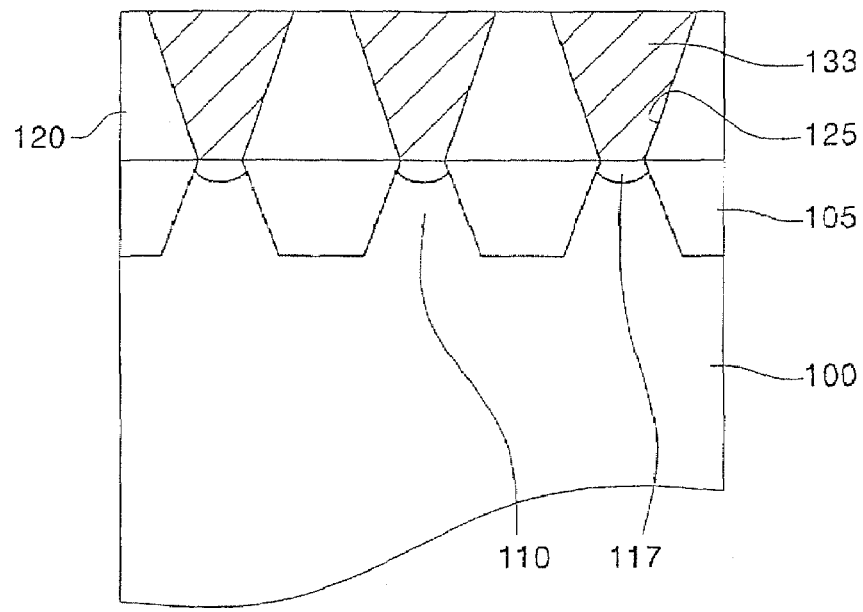
FIGS. 4, 6, 8, 10, 12, 14, 16, 18, 20 and 22 are cross-sectional diagrams taken along line I-I' of FIG. 1 that illustrate a method of fabricating DRAM cells according to some embodiments of the invention.
Figure 5:
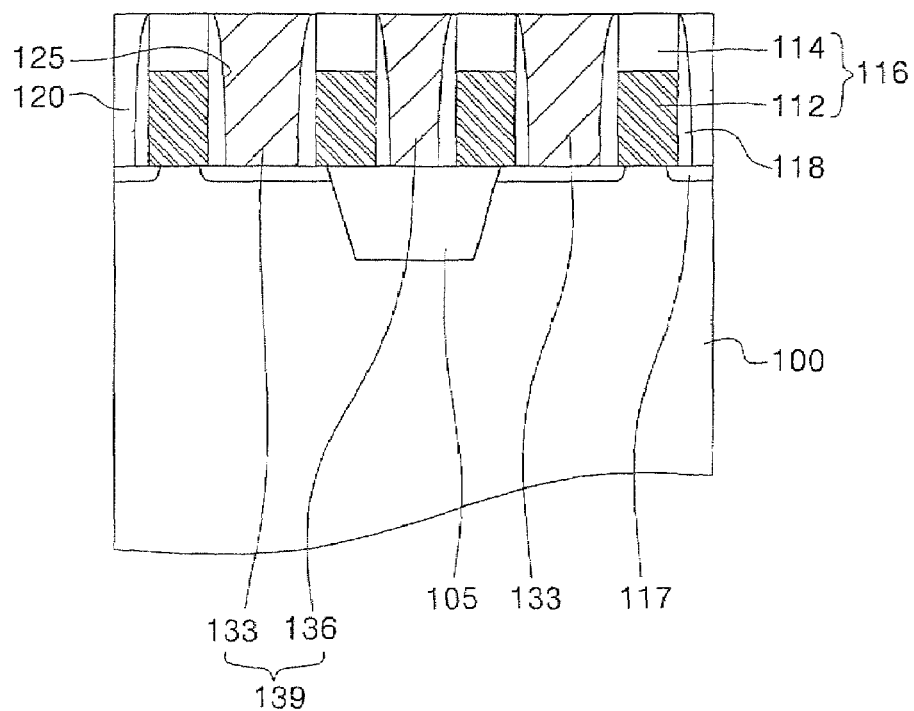
FIGS. 5, 7, 9, 11, 13, 15, 17, 19, 21 and 23 are cross-sectional diagrams taken along line II-II' of FIG. 1 that illustrate a method of fabricating DRAM cells according to some embodiments of the invention.

Referring to FIGS. 1, 4 and 5, an isolation layer 105 is disposed on a predetermined region of the semiconductor substrate 100 to define the active regions 110. Gate patterns 116 are disposed to traverse the active regions 110, and gate spacers 118 are disposed on sidewalls of the gate patterns 116. Each of the gate patterns 116 includes the gate 112 and the gate capping layer pattern 114, and the gate 112 is formed of an N-type doped polysilicon layer or a polycide layer. The gate capping layer pattern 114 is formed of an insulating layer having an etching selectivity ratio different from the isolation layer 105. For example, it is desirable that the gate capping layer pattern 114 is formed of a nitride layer. An implantation process is performed in the active regions 110 by using the gate patterns 116 and the isolation layer 105 as a mask to form impurity regions 117, namely, source/drain regions. Furthermore, the gate spacers 118 may be formed of an insulating layer having the same etching selectivity ratio as the gate capping layer pattern 114. For example, it is desirable that the gate spacers 118 are formed of a nitride layer.

A pad interlayer insulating layer 120 fills gap regions between the gate patterns 116, and pad holes 125 are disposed between the gate patterns 116 to penetrate predetermined regions of the pad interlayer insulating layer 120, and to expose the active regions 110. The pad interlayer insulating layer 120 is formed of an insulating layer having the same etching selectivity ratio as the isolation layer 105. For example, it is desirable that the pad interlayer insulating layer is formed of an oxide layer. Bit line landing pads 136 and storage node landing pads 133, which are formed of an N-type doped polysilicon layer, are disposed to fill the pad holes 125. The bit line landing pads 136 and storage node landing pads 133 may be referred to as landing pads 139. The landing pads 139 may be electrically connected to the impurity regions 117.

Figure 6:
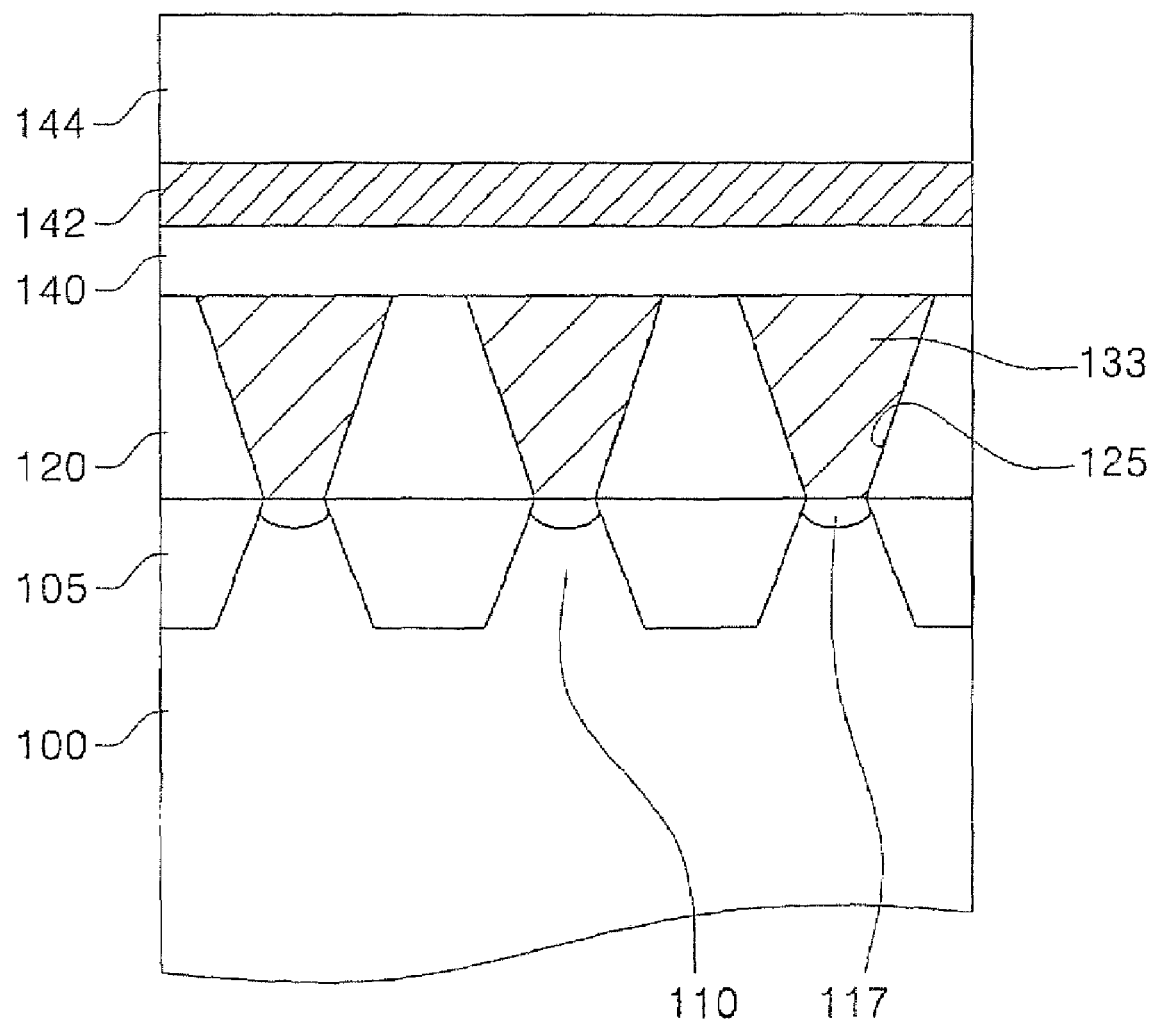
Figure 7:
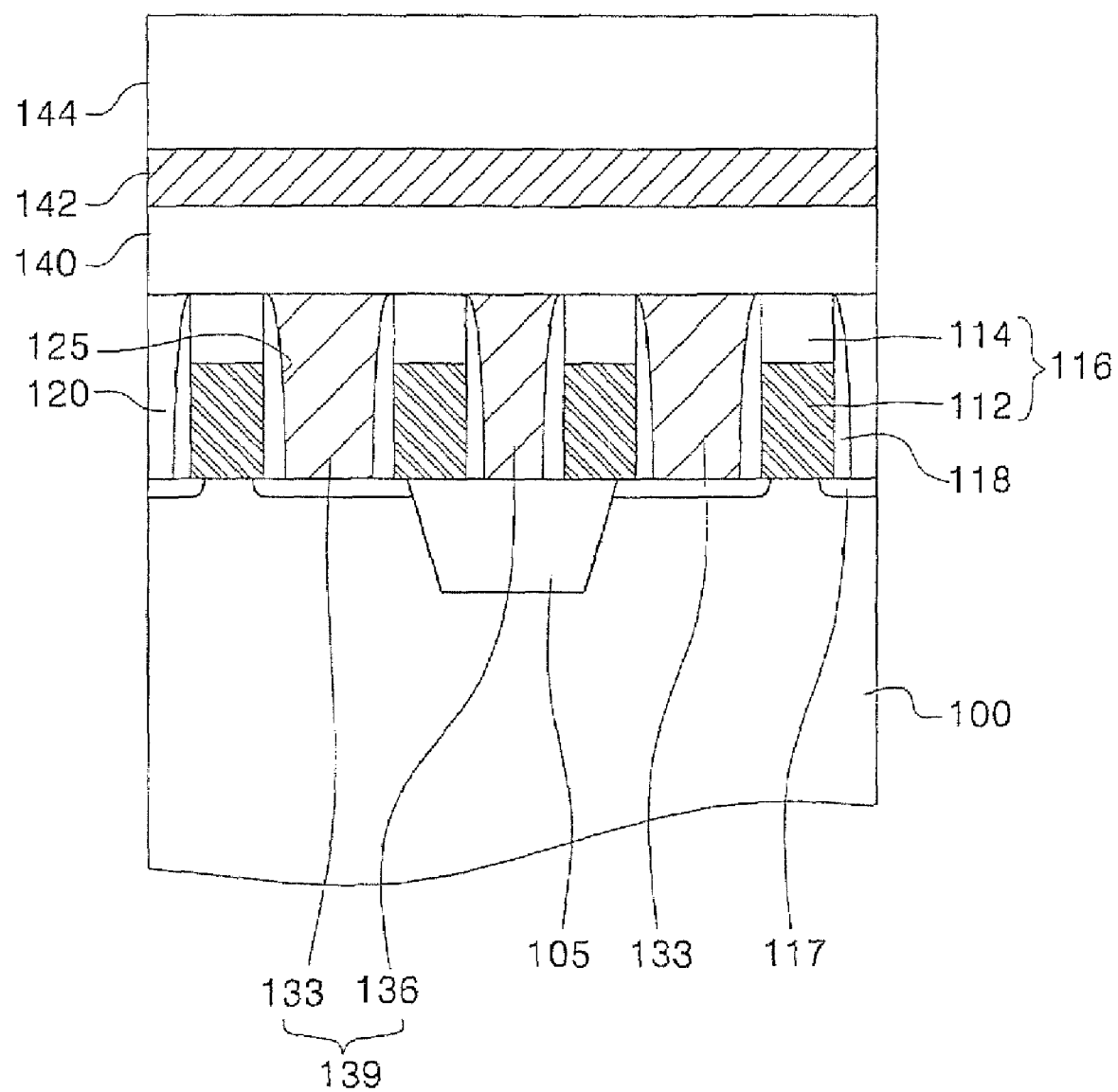

Referring to FIGS. 1, 6 and 7, a bit line interlayer insulating layer 140 covers a surface of the semiconductor substrate having the landing pads 133. It is desirable that the bit line interlayer insulating layer 140 is formed of an insulating layer having the same etching selectivity ratio as the pad interlayer insulating layer 120. Bit line contact holes 141 are disposed in predetermined regions of the bit line interlayer insulating layer 140 to expose the bit line landing pads 136 by using known photo and etching processes. Also, a bit line layer 142 and a bit line capping layer 144 stacked thereon are disposed on the bit line interlayer insulating layer 140 to fill the bit line contact holes 141. The bit line layer 142 may be formed of an N-doped polysilicon layer, a polycide layer, or a metal layer. The bit line capping layers 144 may be formed of an insulating layer having the same etching selectivity ratio as the gate spacers 118. For example, it is desirable that the bit line capping layers are formed of a nitride layer.

Figure 8:
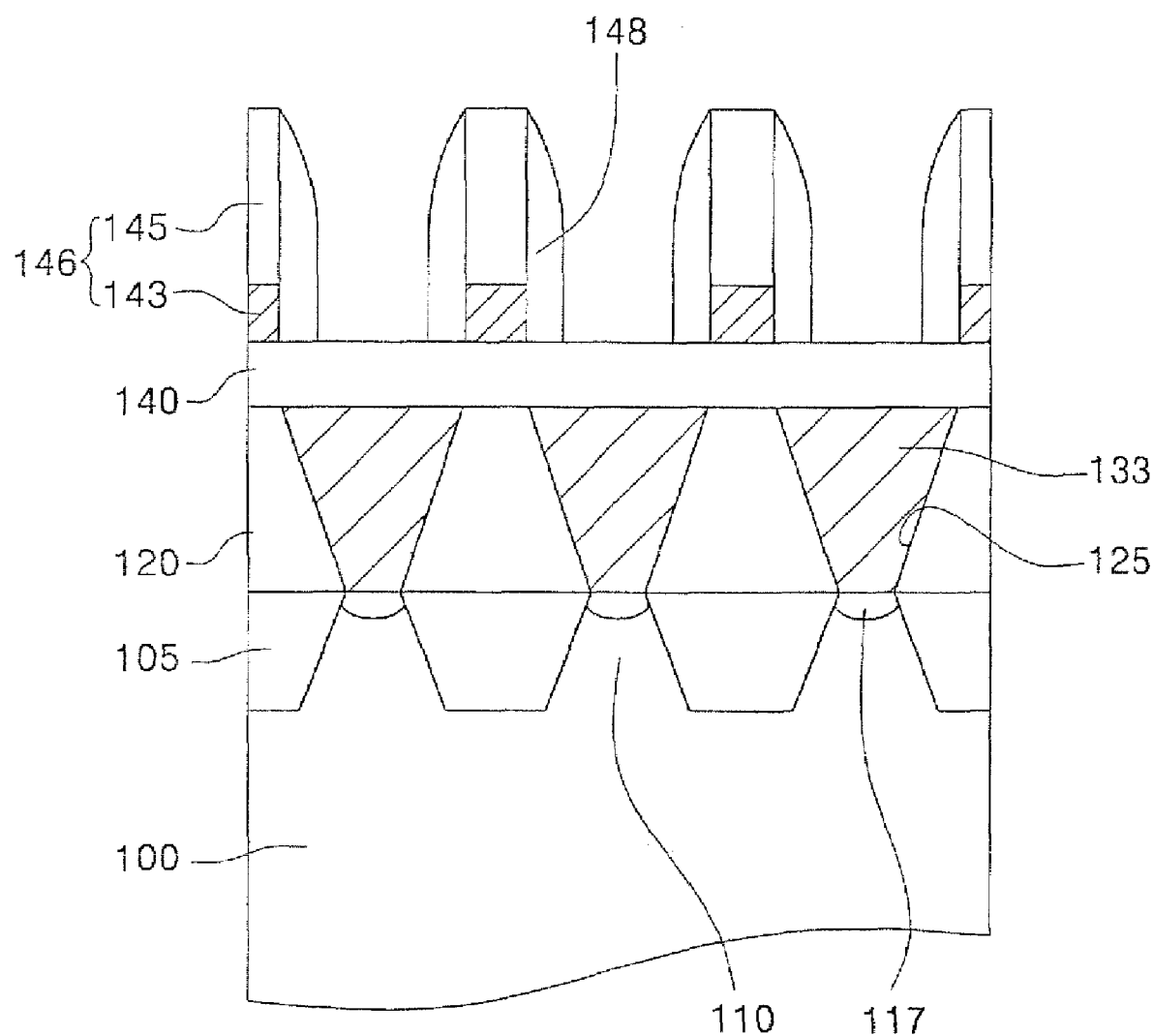
Figure 9:
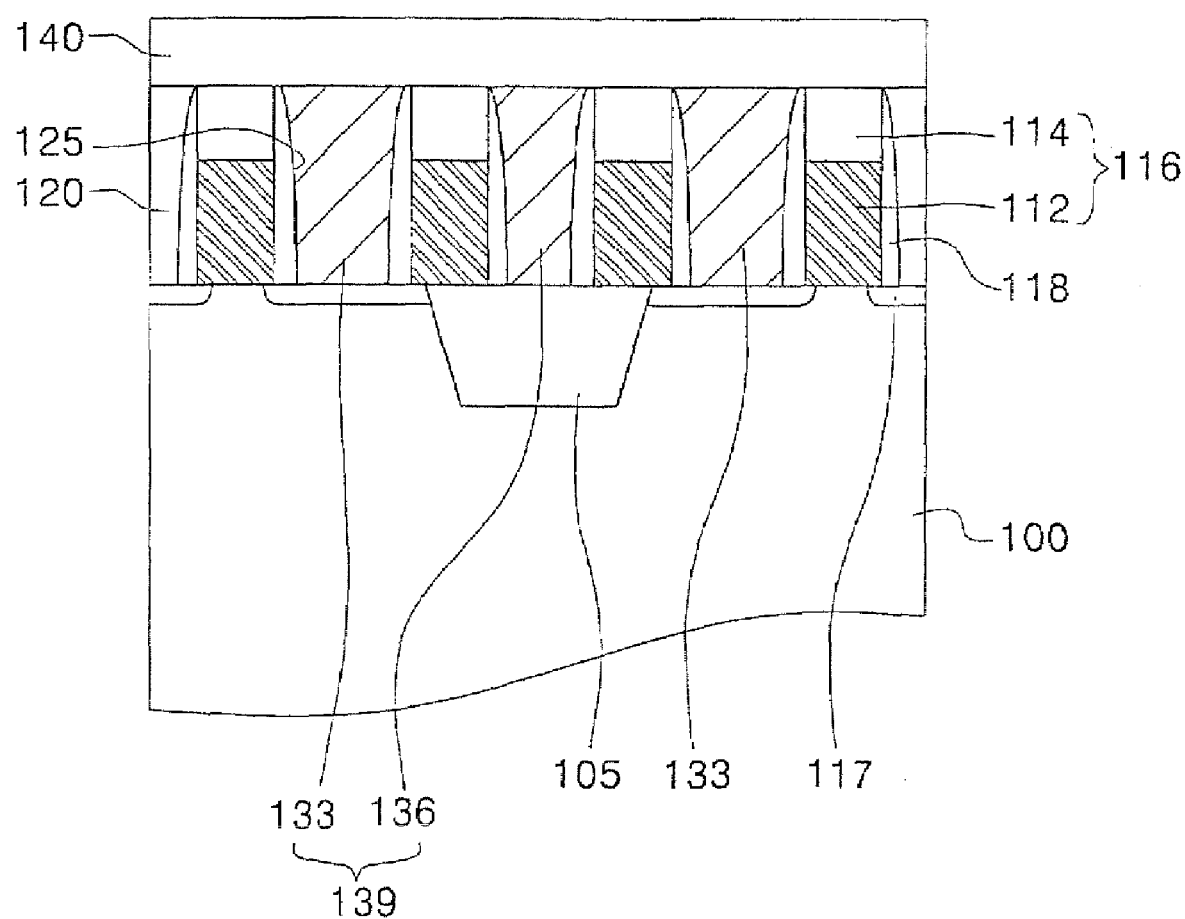

Referring to FIGS. 1, 8 and 9, the bit line layer 142 and the bit line capping layer 144 are sequentially patterned by using the bit line interlayer insulating layer 140 as an etching buffer layer to form a plurality of parallel bit line patterns 146 on the semiconductor substrate 100. Each of the bit line patterns 146 includes a corresponding bit line 143 and bit line capping layer pattern 145 stacked thereon. The bit line patterns 146 are disposed to transverse the gate patterns 116 as shown in FIG. 1. Bit line spacers 148 cover sidewalls of the bit line patterns 146, and the bit line spacers 148 are formed of an insulating layer having the same etching selectivity ratio as the bit line capping layer pattern 145. For example, it is desirable that the bit line spacers 148 are formed of nitride layers.

Figure 10:
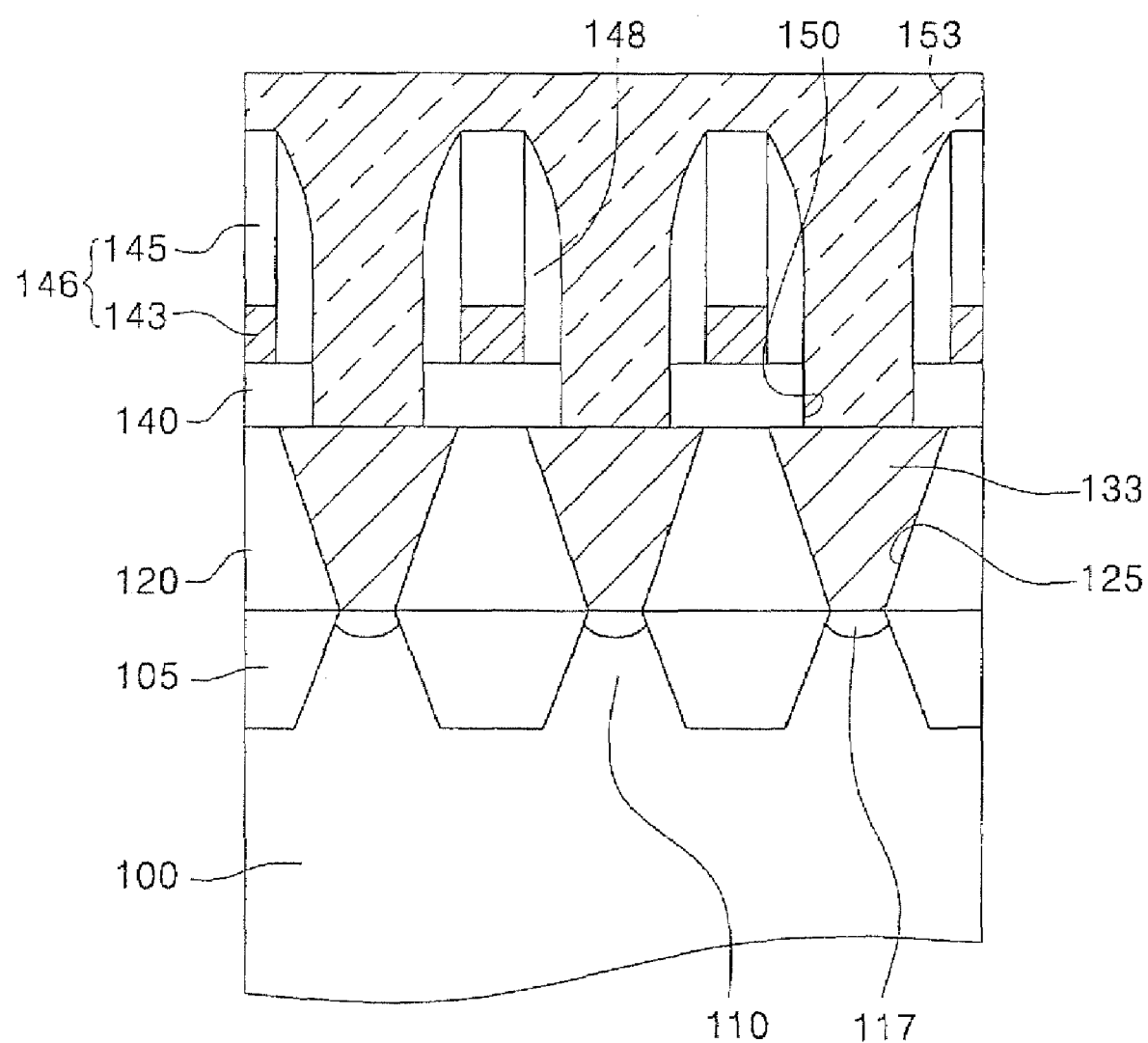
Figure 11:
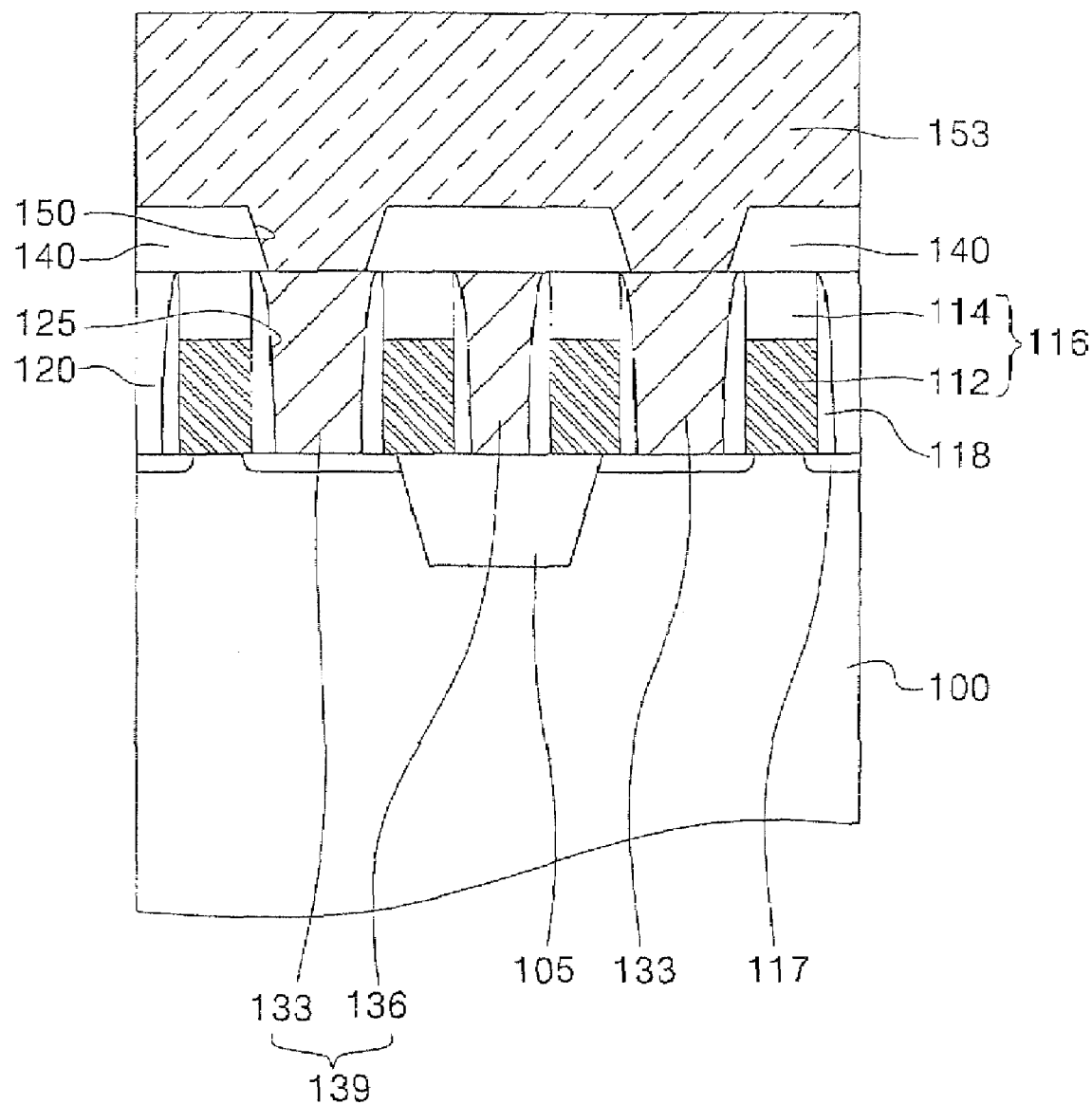

Referring to FIGS. 1, 10 and 11, a photoresist layer (not shown) is formed on the semiconductor substrate having the bit line spacers 148 and the bit line patterns 146. A photo process is performed in the photoresist layer to form openings in predetermined regions between the bit line patterns 146 surrounded by the bit line spacers 148. The openings expose the bit line interlayer insulating layer 140. Sequentially, an etching process is performed by using the photoresist layer as an etching mask to form buried holes 150, which penetrate the bit line interlayer insulating layer 140 to expose the storage landing pads 133. At this time, because the bit line capping layer patterns 145 and the bit line spacers 148 are used as an etching buffer layer during formation of the buried holes 150, the bit line capping layer patterns 145 and the bit line spacers 148 are formed of a nitride layer having a predetermined thickness in order not to expose the bit lines 143. A storage node contact plug layer 153 covers a surface of the semiconductor substrate having the buried holes 150, and the storage node contact plug layer 153 may be formed of an N-type doped polysilicon layer.

Figure 12:
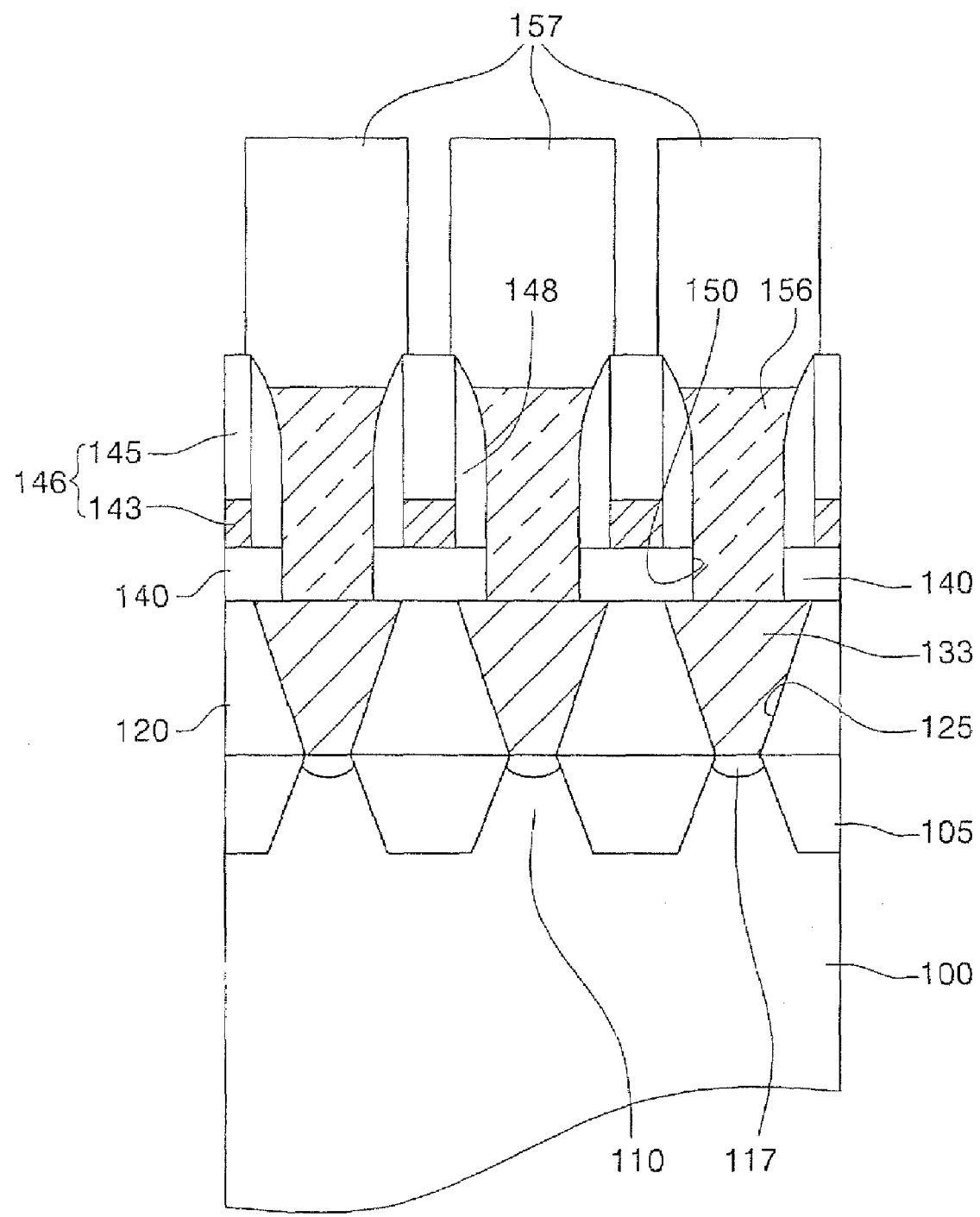
Figure 13:
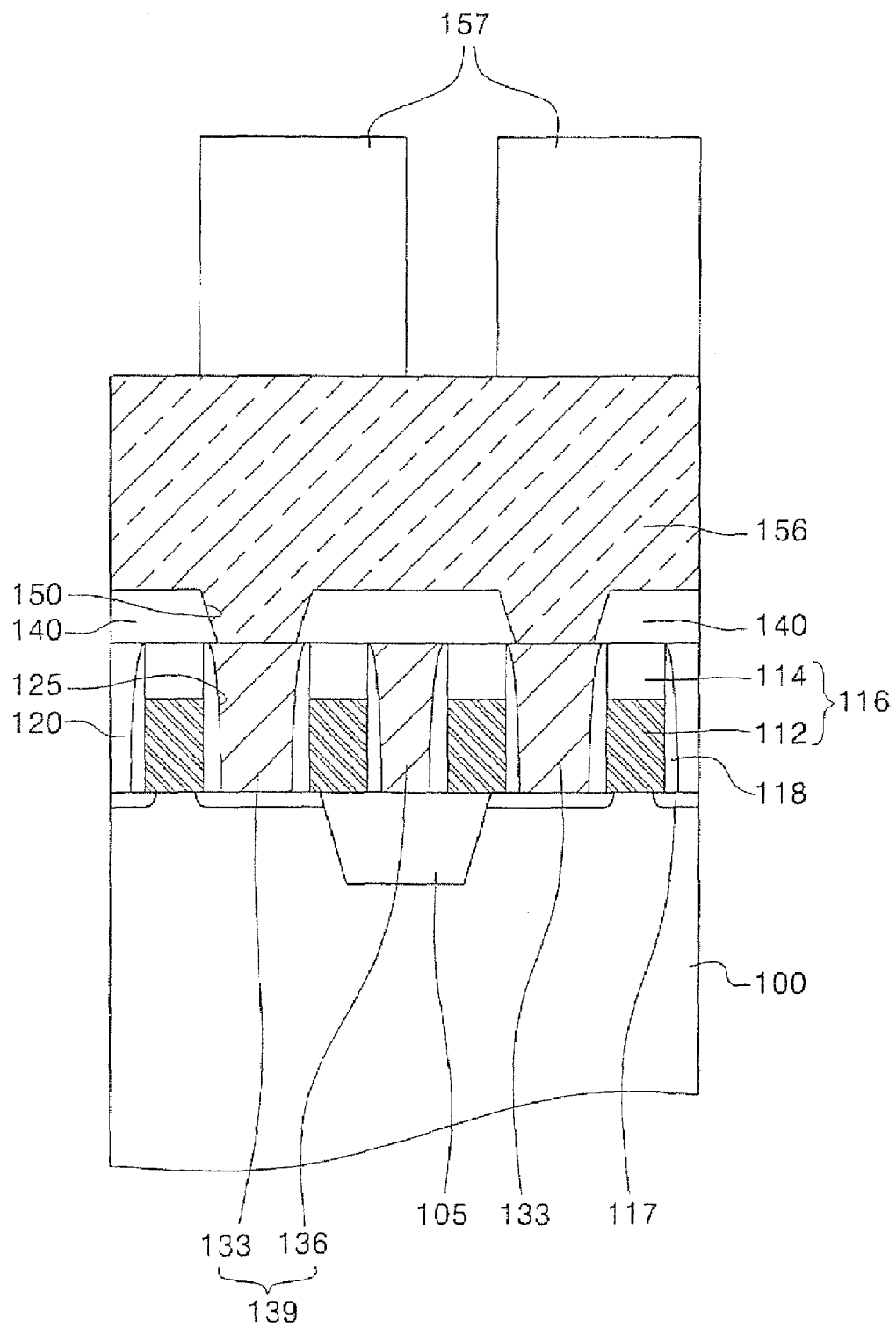
Figure 14:
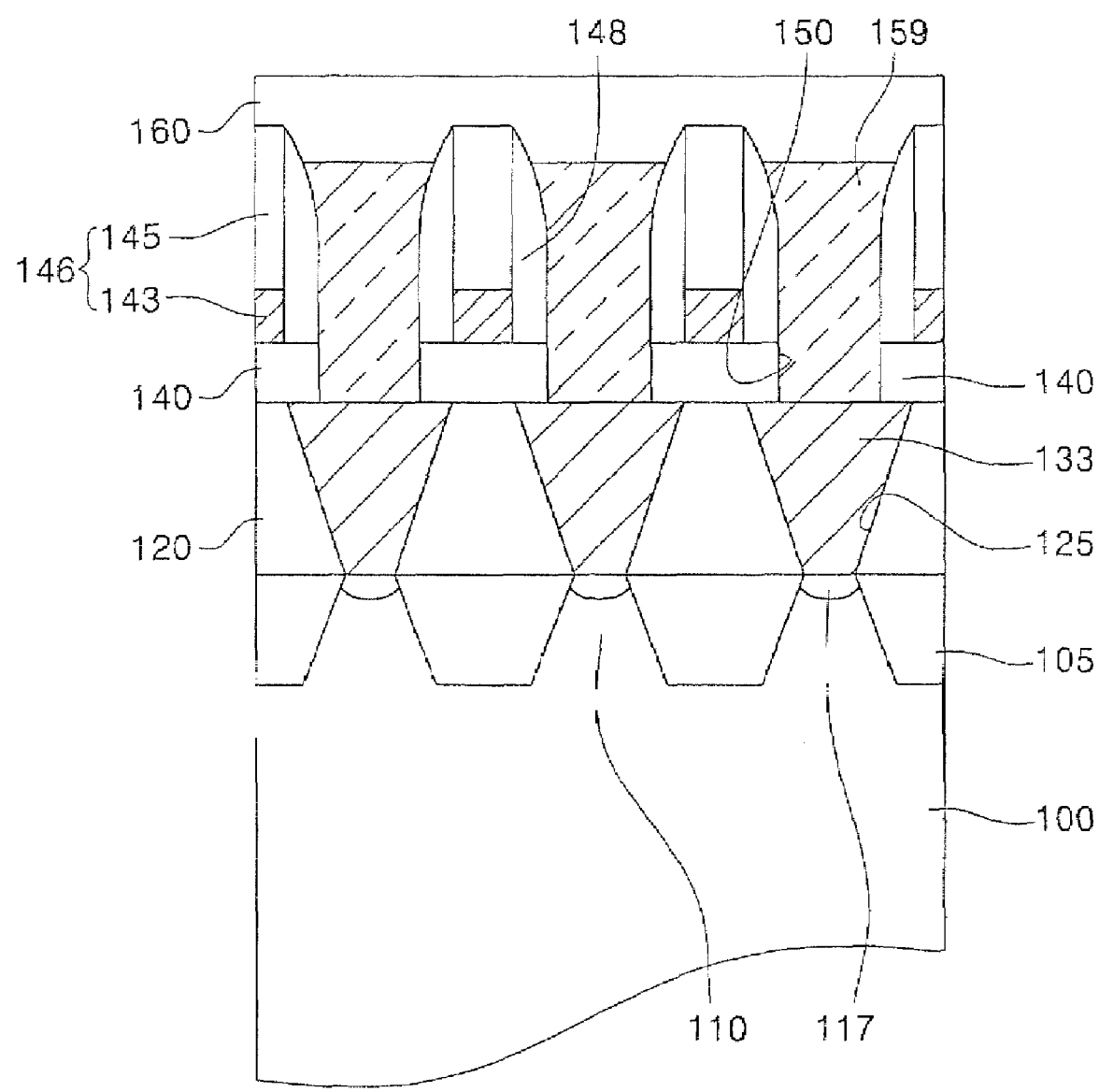
Figure 14A:
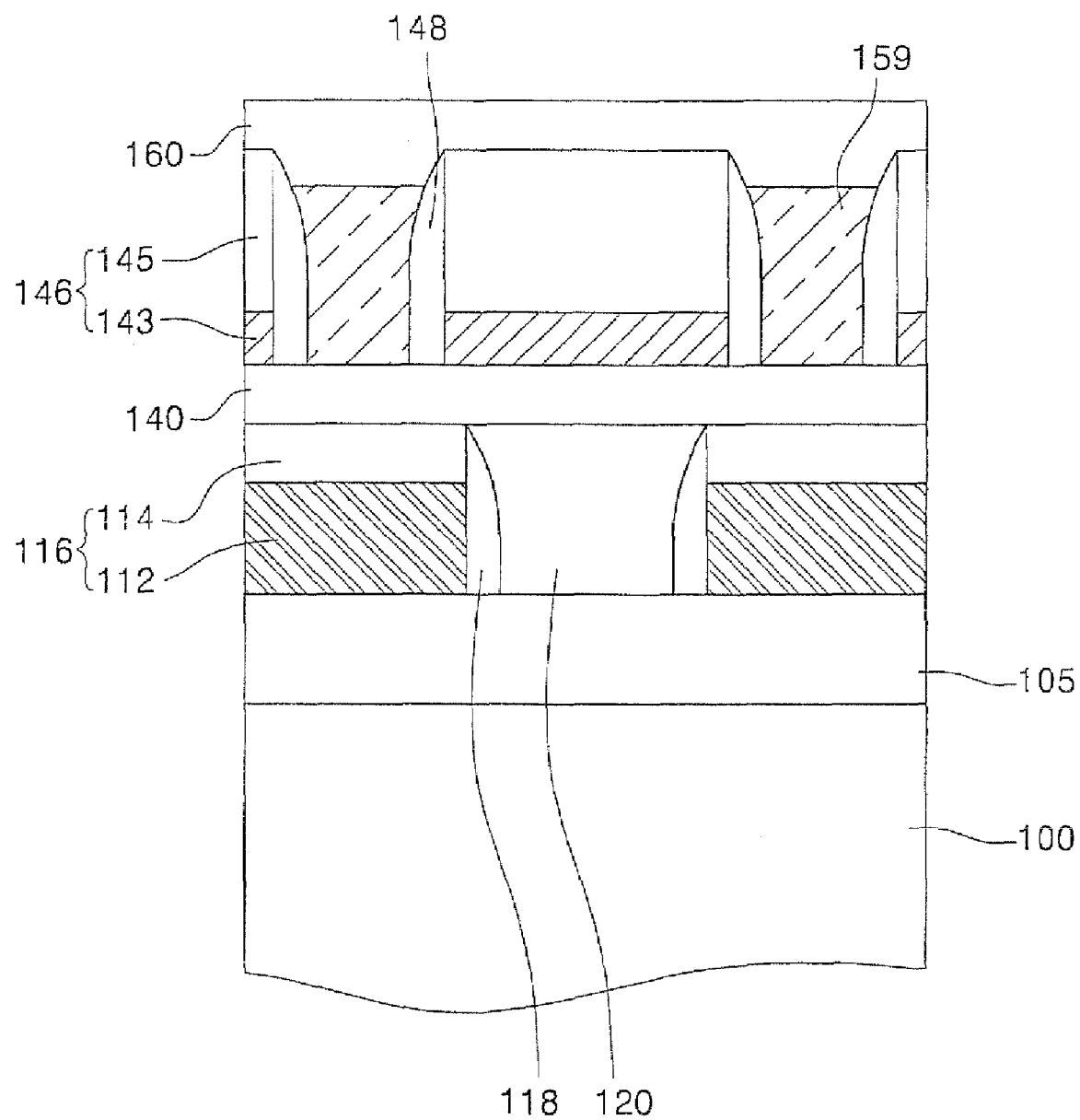
FIG. 14a is a cross-sectional diagram taken along line III-III' of FIG. 1.

Referring to FIGS. 1, 12 and 13, an etching process is carried out on the storage node contact plug layer 153 of FIGS. 10 and 11 until top surfaces of the bit line patterns 146 are exposed to form a plurality of storage node contact plug patterns 156, which are separated by the bit line patterns 146. At this time, the storage node contact plug patterns 156 are positioned along a direction parallel to the bit line patterns 146. Top surfaces of the storage node contact plug patterns 156 may be disposed lower than top surfaces of the bit line patterns 146 or at the same height as top surfaces of the bit line patterns 146. The etching process may be carried out by using a chemical mechanical polishing or by using an etching back process. Photoresist patterns 157 are formed in predetermined regions between the bit line patterns 146. Each of the photoresist patterns 157 is formed to have a rectangular shape between the bit line patterns 146. Referring to FIGS. 1, 14, 14a and 15, an etching process is performed on the storage node contact plug patterns 156 by using the bit line interlayer insulating layer 140 and the photoresist patterns 157 as an etching mask to form bar-shaped storage node contact plugs 159 between the bit line patterns 146. At this time, the storage node contact plugs 159 are arranged in a zigzag manner on the semiconductor substrate having linear active regions 100, as shown in FIG. 1. The storage node contact plugs 159, which are separated by the bit line patterns 146, are disposed to fill the buried holes 150, and to be spaced apart from each other between two adjacent bit line patterns 146. After forming the storage node contact plugs 159, an over-etching process may be carried out on the storage node contact plugs 159 by using the bit line interlayer insulating layer 140 as an etching buffer layer. The over-etching process removes residue of the storage node contact plugs 159 along the sidewalls of the bit line patterns 146.

Figure 15:
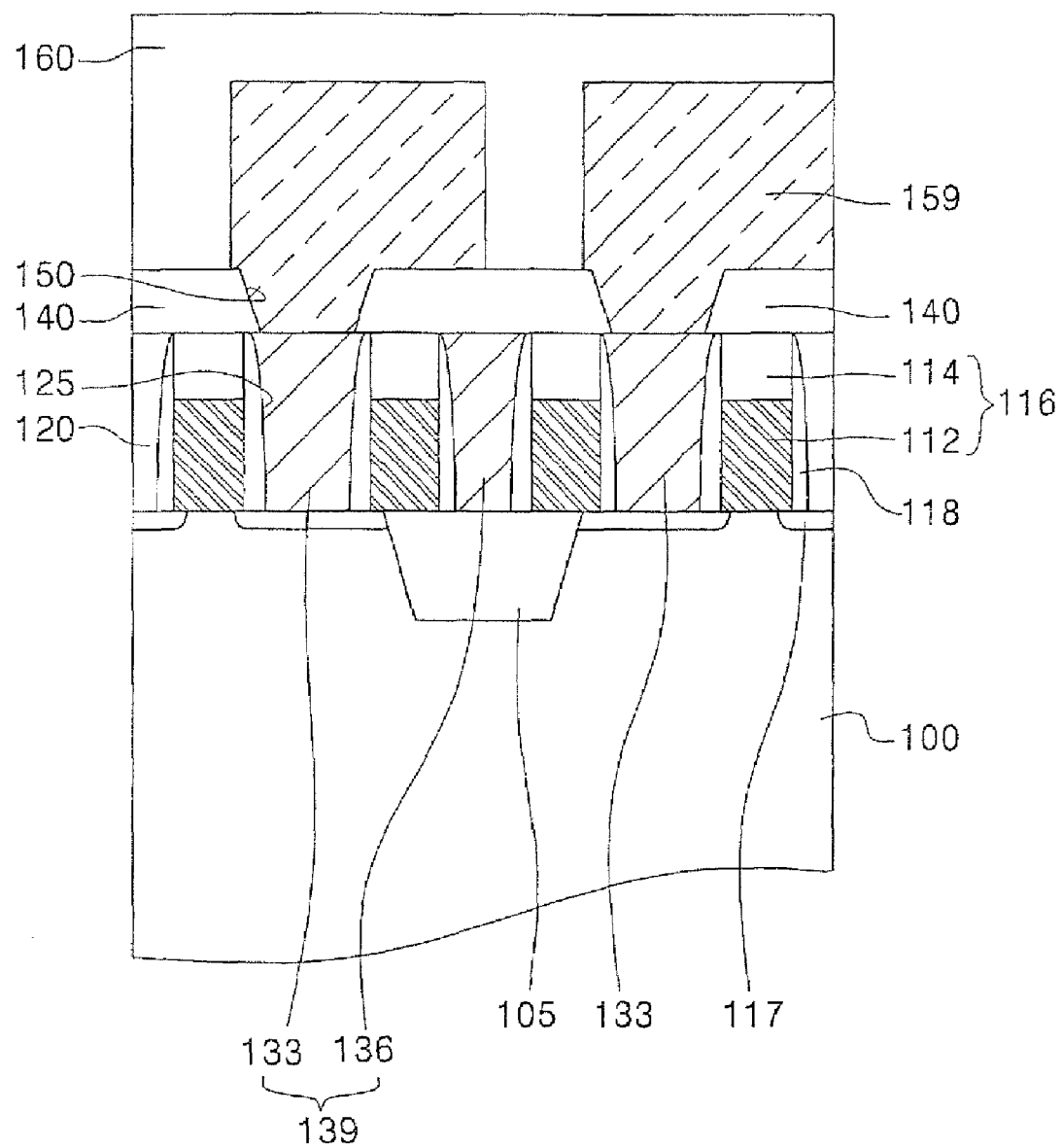

A protection layer 160 covers the semiconductor substrate having the storage node contact plugs 159. As shown in FIG. 15, the protection layer 160 fills the gap regions between the storage node contact plugs 159 in a direction parallel to the bit line patterns 146. The protection layer 160 may be formed of an insulating layer having the same etching selectivity ratio as the bit line interlayer insulating layer 140. The protection layer 160 may be formed of an HDP (High Density Plasma) layer. Filling the gap regions includes forming the protection layer 160 between the bit line patterns 146 and on top surfaces of the storage node contact plugs 159, and planarizing the protection layer 160 to a predetermined thickness from the top surfaces of the bit line capping layer patterns 145.

Meanwhile, a diameter of the buried holes 150 may be increased by carrying out a wet etching process on the bit line interlayer insulating layer 140 of FIGS. 10 and 11. This decreases the contact resistance between the storage node landing pads 133 and the storage node contact plugs 159. At this time, the wet etching is carried out on the bit line interlayer insulating layer 140 by using the bit line spacers 148 as an etching buffer layer to the extent that the storage node contact plugs 159 do not have a short circuit to the bit lines 143.

Figure 16:
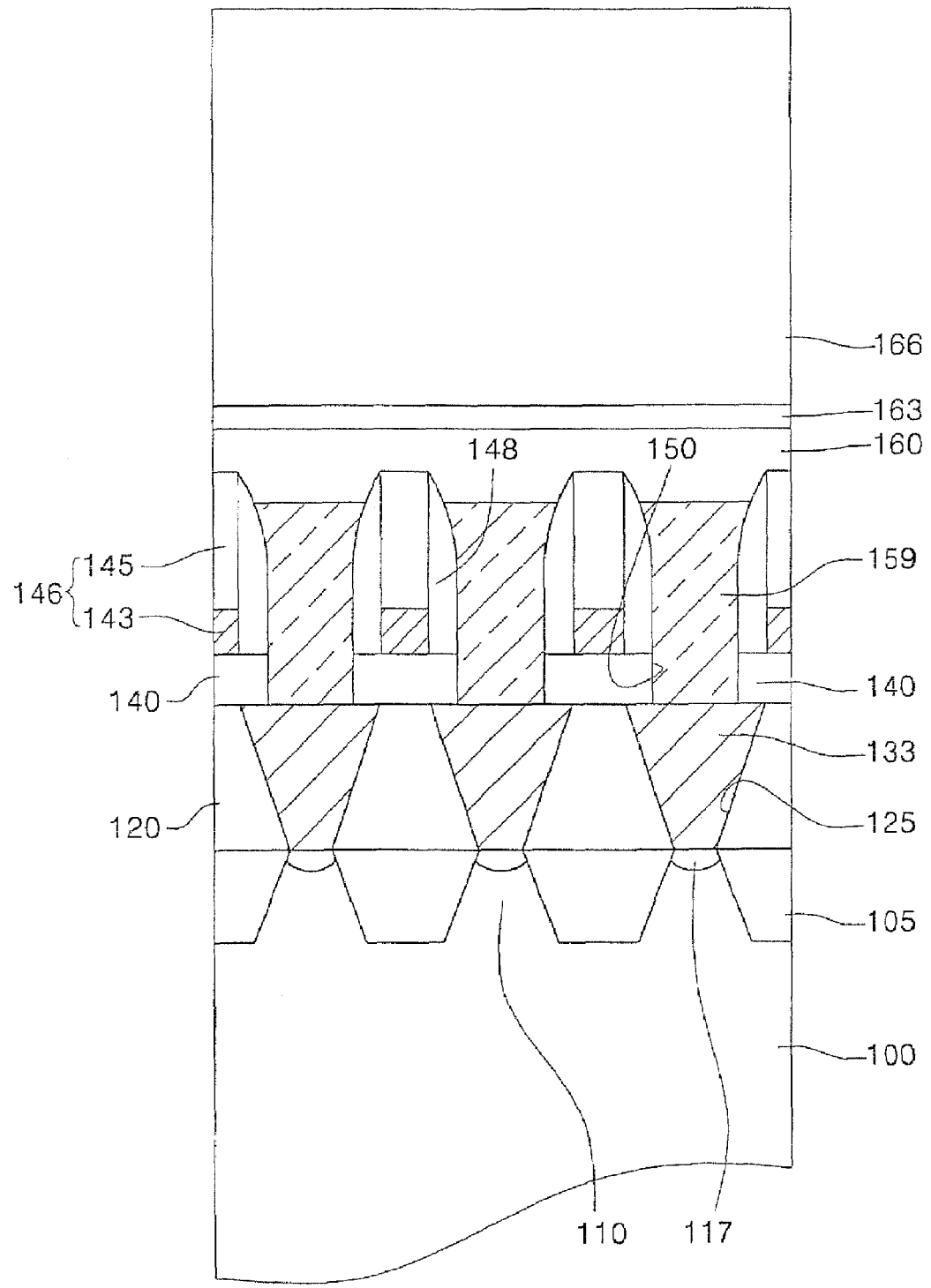
Figure 17:
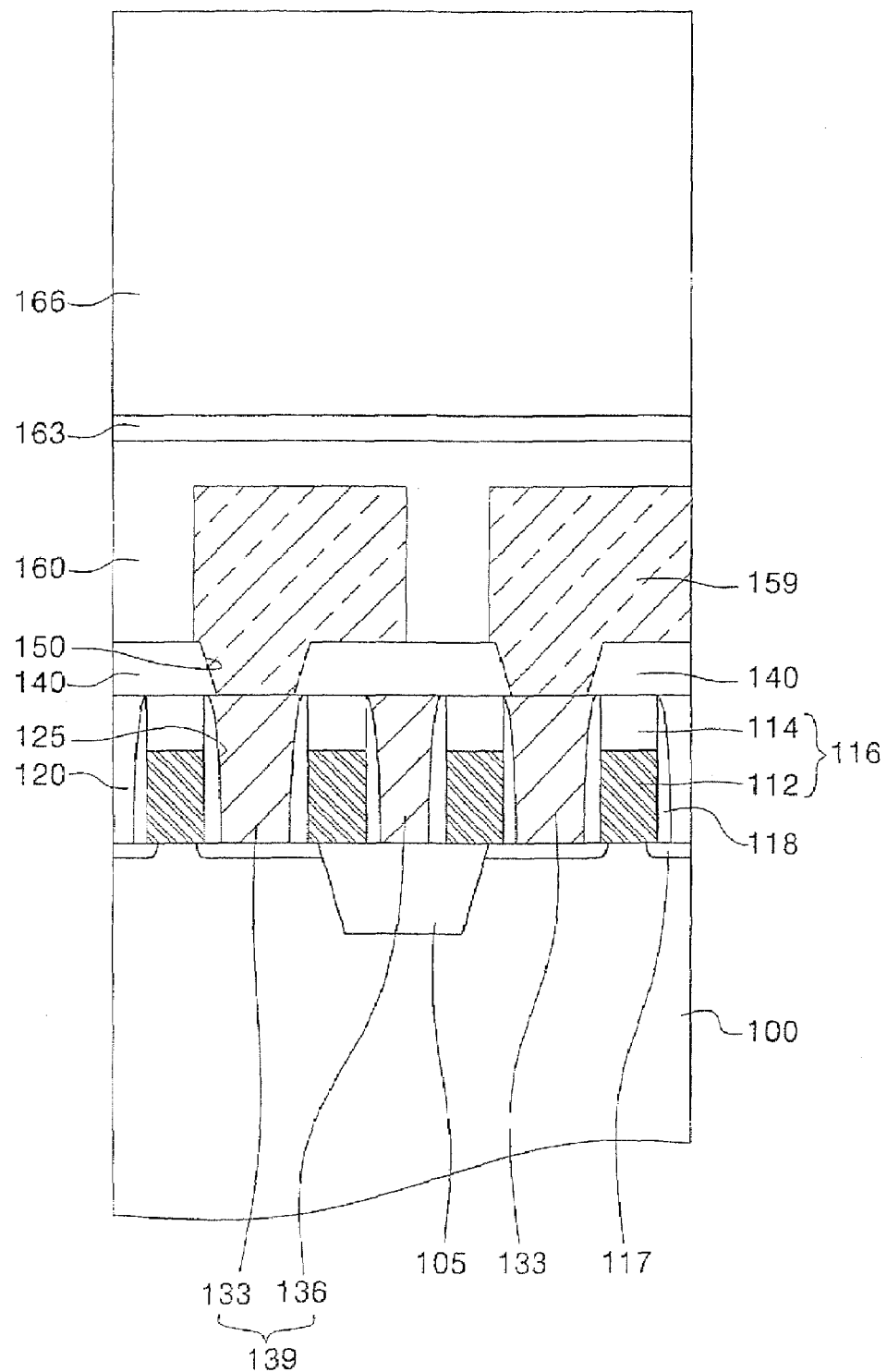

Referring to FIGS. 1, 16 and 17, the etch stop layer 163 and the molding layer 166 are stacked in sequence on the semiconductor substrate having the protection layer 160. The molding layer 166 may be formed of an insulating layer having the same etching selectivity ratio as the protection layer 160, for example, an oxide layer. The etch stop layer 163 may be formed of an insulating layer having an etching selectivity ratio different from the molding layer 166, for example, a nitride layer.

Figure 18:
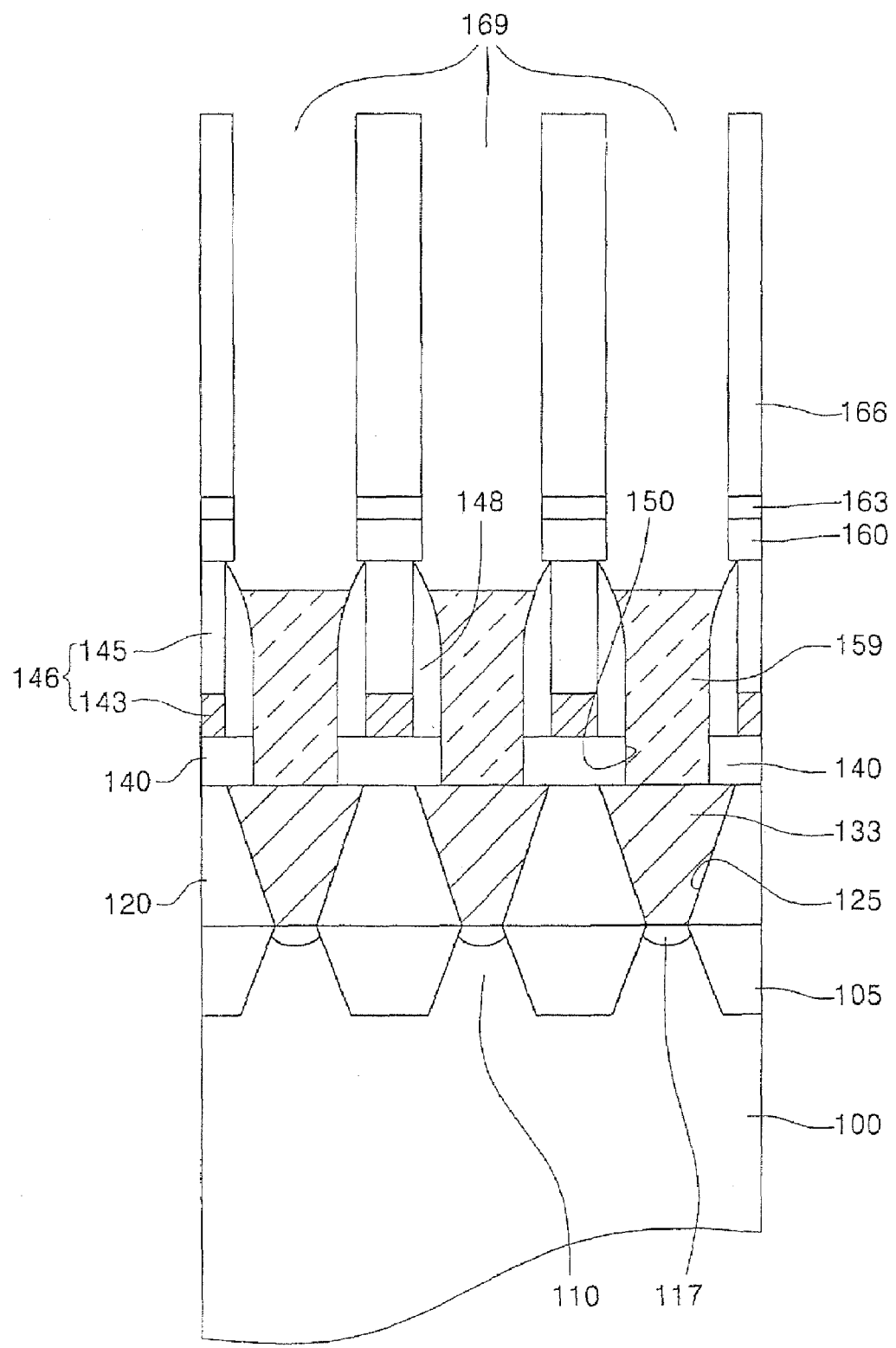
Figure 19:
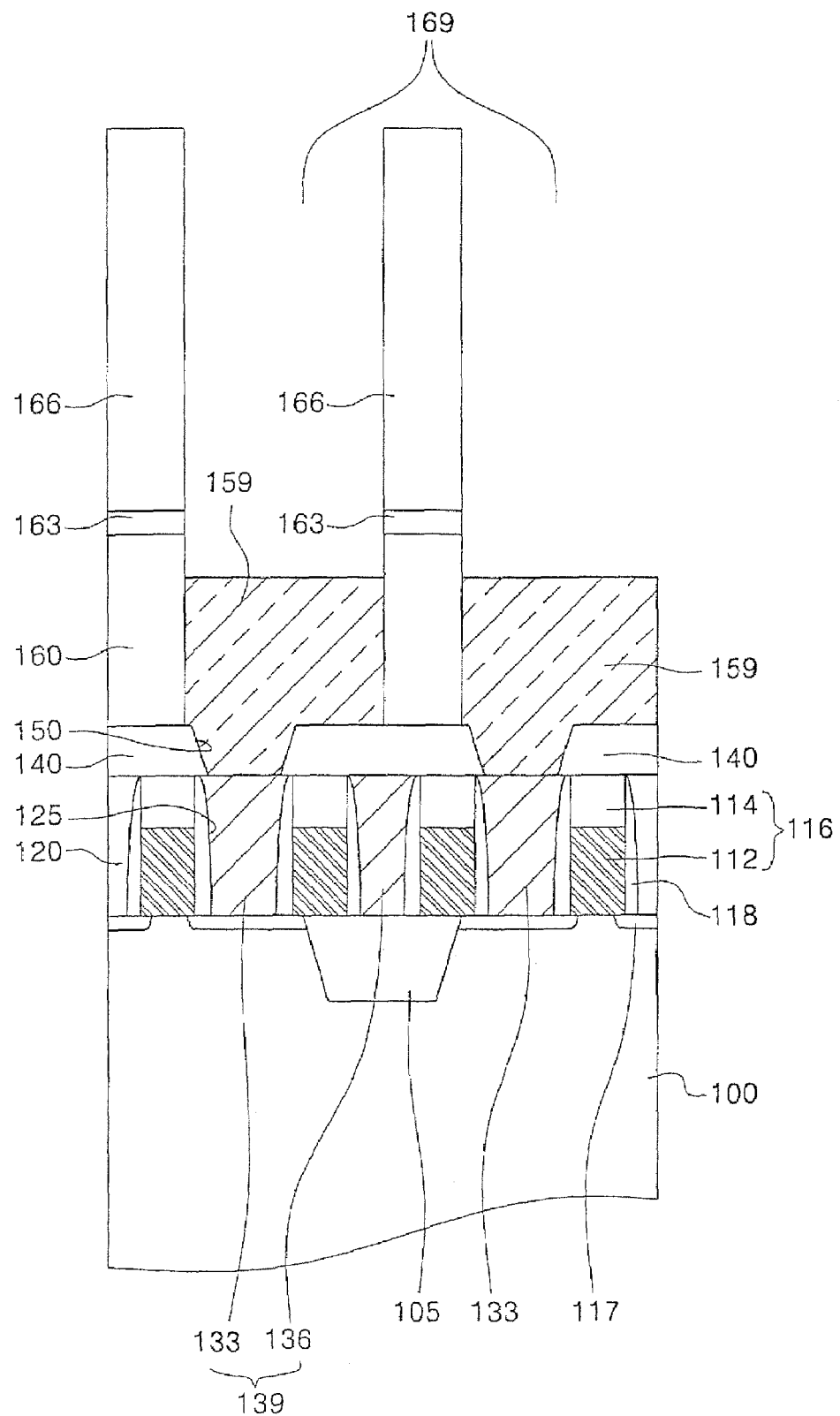

Referring to FIGS. 1, 18 and 19, an etching process is sequentially performed on the molding layer 166, the etch stop layer 163, and the protection layer 160 to form storage node holes 169, which penetrate the molding layer 166, the etch stop layer 163, and the protection layer 160 to expose the storage node contact plugs 159. Furthermore, the storage node holes 169 expose the top sides of the bit line spacers 148. At this time, the etch stop layer 163 functions as an etching buffer layer during etching of the molding layer 166 so that the bit line patterns 146 are not greatly exposed by an attack to the protection layer 160. Also, as shown in FIG. 1, the storage node contact plugs 159 are sufficiently overlapped with the storage node holes 169 along a direction parallel to each of the bit line patterns 146 and the gate patterns 116. This provides process freedom and allows the design rule of the DRAM cells to be reduced in order to successfully achieve increased levels of circuitry integration.

Figure 20:
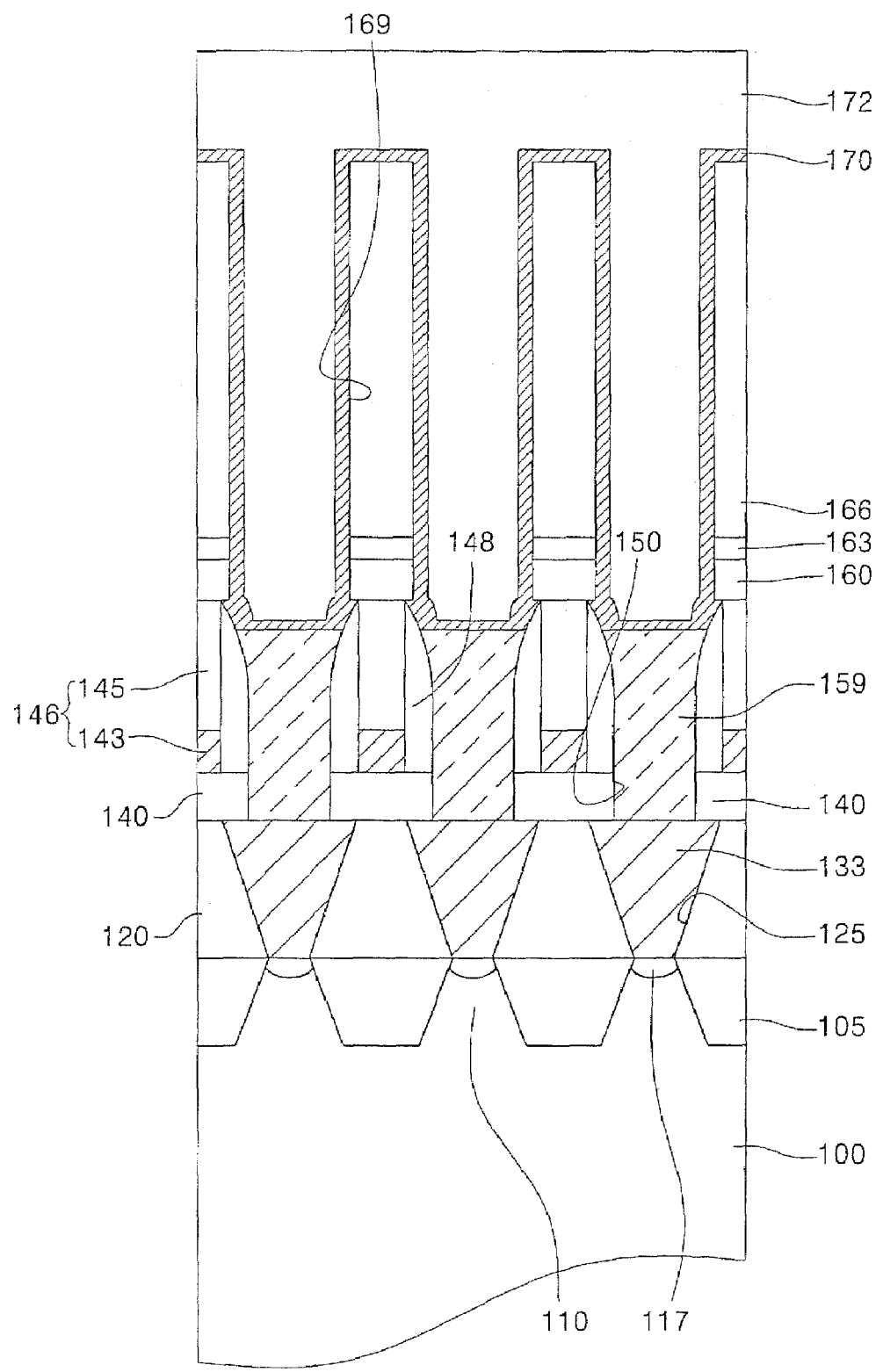
Figure 21:
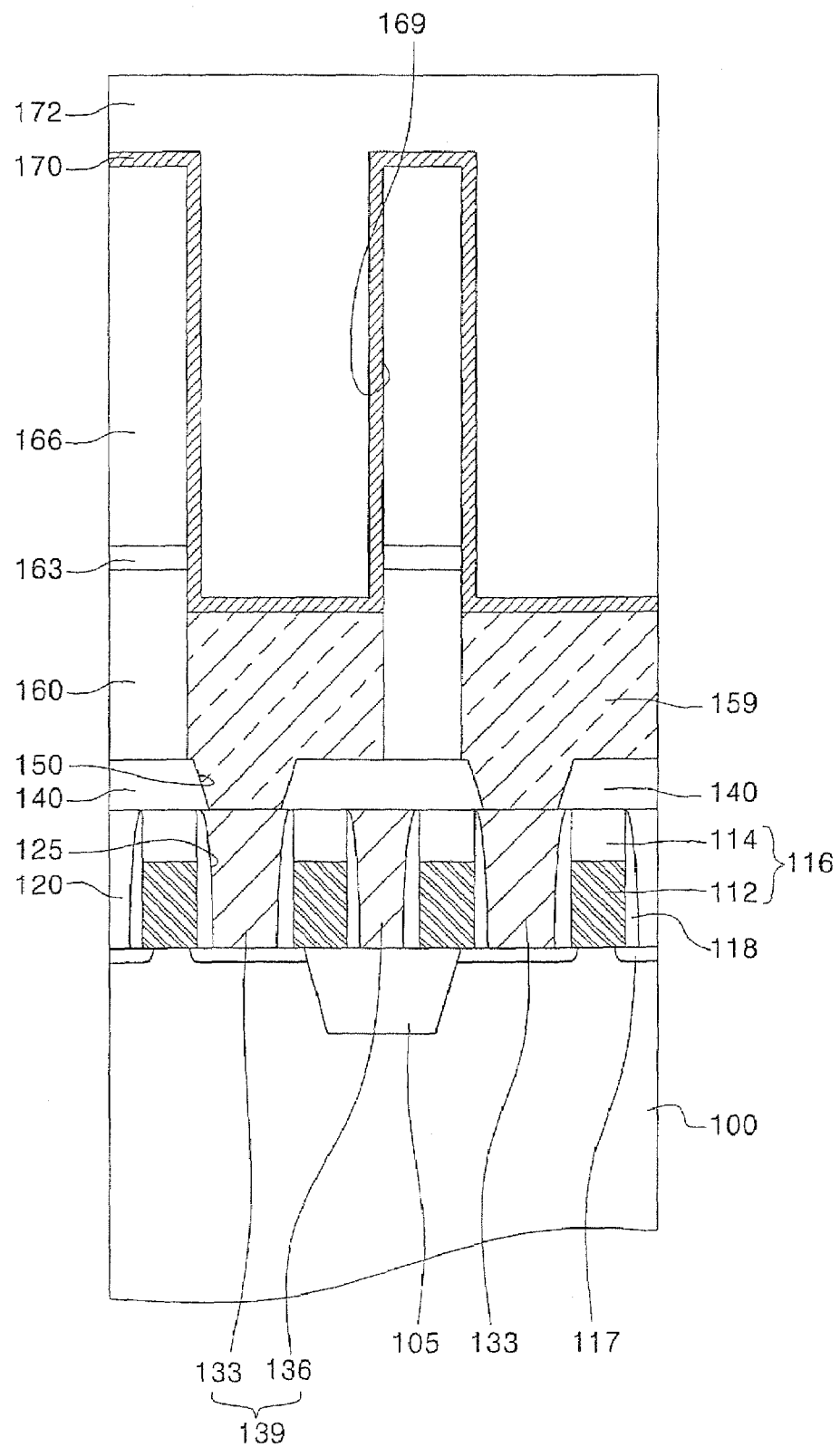

Referring to FIGS. 1, 20 and 21, a storage node layer 170 may be conformally formed in the storage node holes 169 and on a top surface of the molding layer 166. A sacrificial layer 172 may be disposed on the storage node layer 170 to fill the storage node holes 169. The storage node layer 170 may be formed of an N-type doped polysilicon layer, and the sacrificial layer 172 may be formed of an insulating layer having the same etching selectivity ratio as the molding layer 166. For example, it is desirable that the sacrificial layer 172 is formed of an oxide layer.

Figure 22:
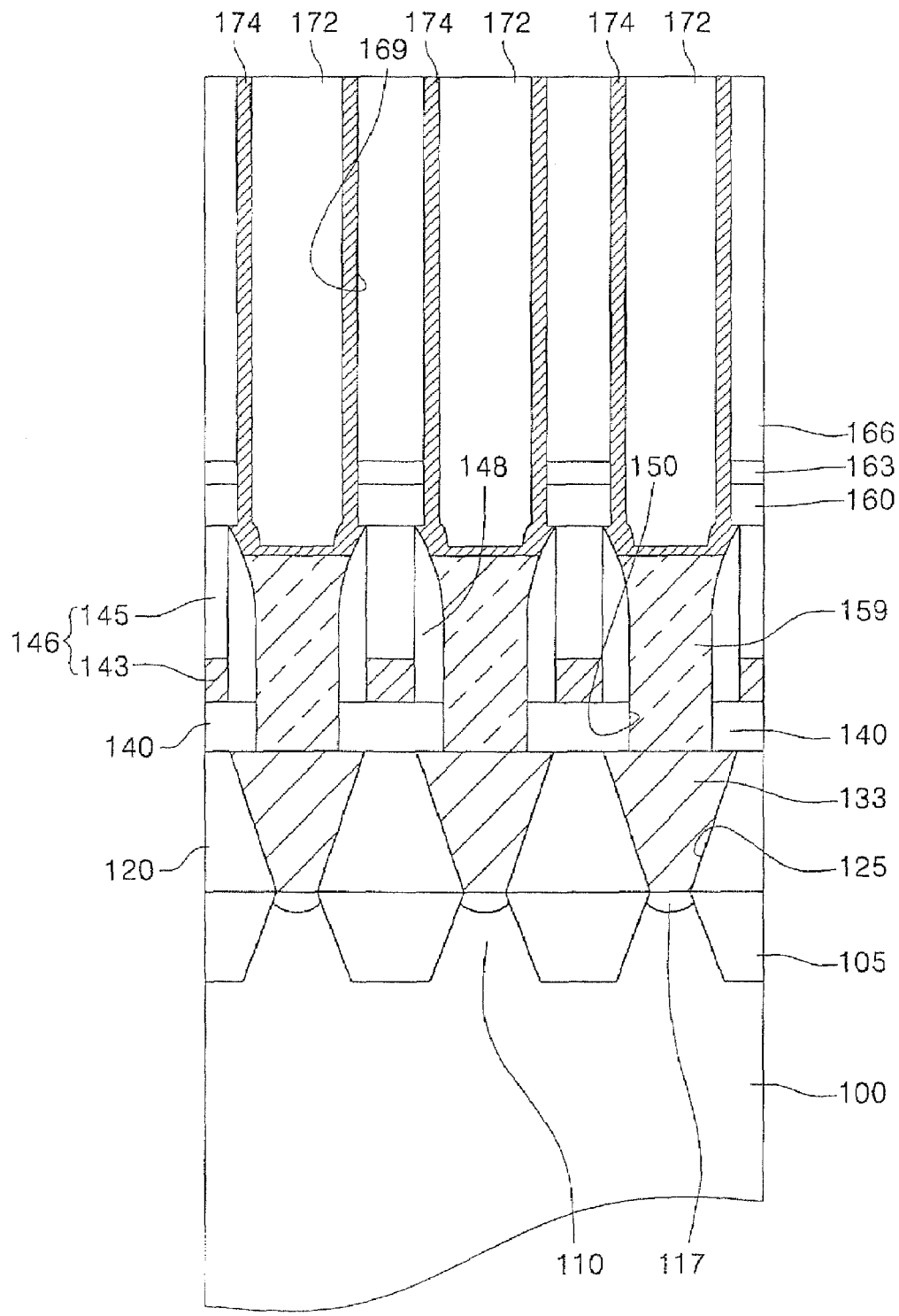
Figure 23:
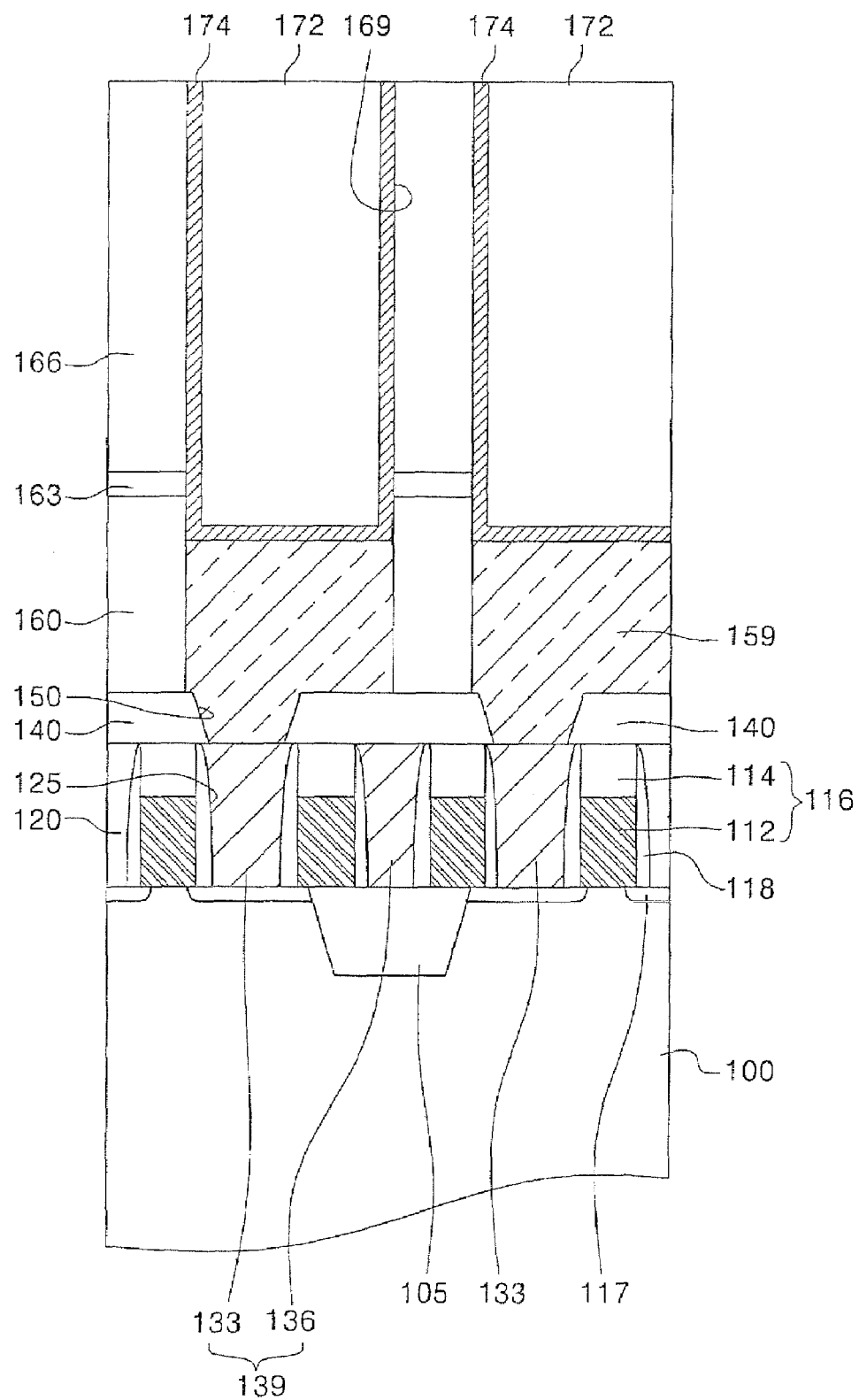

Referring to FIGS. 1, 22 and 23, the sacrificial layer 172 and the storage node layer 170 are sequentially etched until the top surface of the molding layer 166 is exposed to form storage nodes 174, which are disposed in the storage node holes 169. Forming the storage nodes 174 includes carrying out a planarization process on the sacrificial layer 172 until the storage node layer 170 is exposed, and carrying out an etching process on the storage node layer 170 until the top surface of the molding layer 166 is exposed. The planarization process can be performed by a chemical mechanical polishing or an etching back. At this time, the storage nodes 174 contact the top surfaces of the storage node contact plugs 159 through the storage node holes 169.

As described above, embodiments of the invention provide bar-shaped storage node contact plugs, which provide a semiconductor fabrication process margin capable of sufficiently overlapping storage node holes arranged on the cell array regions of the DRAM cells, thereby improving driving capability of the DRAM cells.

The invention may be practiced in many ways. What follows, are exemplary, non-limiting descriptions of embodiments of the invention.

Embodiments of the invention provide a DRAM cell having bar-shaped storage node contact plugs that are suitable for being sufficiently connected with storage nodes and methods of fabricating the same.

According to some embodiments of the invention, there is provided a DRAM (dynamic random access memory) cell that includes a bit line interlayer insulating layer placed over a semiconductor substrate. A plurality of parallel bit line patterns are placed on the bit line interlayer insulating layer. Each of the bit line patterns includes a bit line and a bit line capping layer pattern stacked thereon. Bit line spacers cover side walls of the bit line patterns, and buried holes penetrates predetermined regions of the bit line interlayer insulating layer between the bit line patterns. A plurality of storage node contact plugs are disposed between the bit line patterns surrounding by the bit line spacers. At this time, the storage node contact plugs fill the buried holes.

According to other embodiments of the invention, methods of fabricating a DRAM cell include forming a bit line interlayer insulating layer over a semiconductor substrate. Next, a plurality of parallel bit line patterns are formed on the bit line interlayer insulating layer, each of the bit line patterns including a bit line and a bit line capping layer pattern stacked thereon. Bit line spacers are formed on sidewalls of the bit line patterns. The bit line interlayer insulating layer is selectively etched to form buried holes in predetermined regions between the bit line patterns. A plurality of storage node contact plug patterns are disposed between the bit line patterns to fill the buried holes. Photoresist patterns are disposed on the semiconductor substrate having the storage node contact plug patterns, and the photoresist patterns are formed in predetermined regions between the bit line patterns. The storage node contact plug patterns are etched by using the photoresist patterns, the bit line patterns, the bit line spacers, and the bit line interlayer insulating layer as an etching mask to form storage node contact plugs.

The invention claimed is:

1. A method of fabricating a DRAM cell comprising:
   forming a bit line interlayer insulating layer over a semiconductor substrate;
   forming parallel bit line patterns on the bit line interlayer insulating layer, each of the bit line patterns including a bit line and a bit line capping layer pattern stacked thereon;
   forming bit line spacers on sidewalls of the parallel bit line patterns;
   selectively etching the bit line interlayer insulating layer between the parallel bit line patterns to form buried holes;
   filling the buried holes with storage node contact plug patterns;
   forming photoresist patterns on the semiconductor substrate having the storage node contact plug patterns, the photoresist patterns disposed between the parallel bit line patterns; and
   etching the storage node contact plug patterns by using photoresist patterns, the bit line patterns, the bit line spacers, and the bit line interlayer insulating layer as an etching mask to form storage node contact plugs.

2. The method according to claim 1, wherein selectively etching the bit line interlayer insulating layer to form buried holes comprises:
   forming a photoresist layer on the semiconductor substrate having the bit line patterns and the bit line spacers;
   performing a photo process in the photoresist layer to form openings in the predetermined regions between the bit line patterns;
   etching the bit line interlayer insulating layer through the openings by using the photoresist layer as an etching mask; and
   removing the photoresist layer from the semiconductor substrate.

3. The method according to claim 1, wherein forming photoresist patterns comprises forming rectangular photoresist patterns.

4. The method according to claim 1, further comprising, before filling the buried holes with storage node contact plug patterns, wet etching the bit line interlayer insulating layer by using the bit line spacers and the bit line capping layer patterns as an etching buffer layer.

5. The method according to claim 1, wherein filling the buried holes with storage node contact plug patterns comprises:
   forming a storage node contact plug layer on a surface of the semiconductor substrate having the parallel bit line patterns and the buried holes; and
   etching the storage node contact plug layer to expose top surfaces of the parallel bit line patterns.

6. The method according to claim 5, wherein etching the storage node contact plug layer comprises chemical mechanical polishing.

7. The method according to claim 5, wherein etching the storage node contact plug layer comprises etching back.

8. The method according to claim 1, further comprising, after forming the storage node contact plugs:
   over-etching the storage node contact plugs by using the bit line interlayer insulating layer as an etching buffer layer; and
   removing the photoresist patterns from the semiconductor substrate.

9. The method according to claim 1, further comprising, before forming the bit line interlayer insulating layer:
   forming an isolation layer to define active regions of the semiconductor substrate;
   forming gate patterns in a direction traversing the active regions, each of the gate patterns being formed of a gate and a gate capping layer pattern stacked thereon;
   forming gate spacers on sidewalls of the gate patterns;
   forming a pad interlayer insulating layer on a surface of the semiconductor substrate having the gate patterns and the gate spacers;
   forming pad holes penetrating the pad interlayer insulating layer between the gate patterns; and
   forming landing pads filling the pad holes, the landing pads including bit line landing pad and storage node landing pads, wherein the storage node landing pads contact the storage node contact plugs.

* * * * *